(12) United States Patent
Bansal et al.

(10) Patent No.: US 11,362,538 B2
(45) Date of Patent: Jun. 14, 2022

(54) UNINTERRUPTIBLE POWER SUPPLY COMPONENT ANALYSIS SYSTEM AND METHOD

(71) Applicant: SCHNEIDER ELECTRIC IT CORPORATION, Foxboro, MA (US)

(72) Inventors: Subhash Chand Bansal, Bangalore (IN); Sumandra Ghosh Chowdhury, Bangalore (IN); Murali Krishna Kalvakunta, Bangalore (IN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/161,073

(22) Filed: Jan. 28, 2021

(65) Prior Publication Data
US 2021/0242711 A1 Aug. 5, 2021

(30) Foreign Application Priority Data
Jan. 31, 2020 (IN) .............................. 202011004304

(51) Int. Cl.
*H02J 9/06* (2006.01)
*G01R 31/327* (2006.01)
(Continued)

(52) U.S. Cl.
CPC ............ *H02J 9/06* (2013.01); *G01R 31/3278* (2013.01); *G01R 31/40* (2013.01); *H02J 9/062* (2013.01); *H02M 3/04* (2013.01); *H02M 7/44* (2013.01)

(58) Field of Classification Search
CPC ... H02J 9/06; H02J 9/062; H02J 9/068; G01R 31/3278; G01R 31/40; G01R 31/3277;
(Continued)

(56) References Cited

U.S. PATENT DOCUMENTS

2015/0022003 A1* 1/2015 Dighrasker ............. H02J 9/062
307/65
2020/0014238 A1 1/2020 Daniels

FOREIGN PATENT DOCUMENTS

CN 106950448 A 7/2017
CN 107656200 A 2/2018
(Continued)

OTHER PUBLICATIONS

Lukovic, Slobodan, et al. "A methodology for proactive maintenance of uninterruptible power supplies." 2016 Seventh Latin-American Symposium on Dependable Computing (LADC). IEEE, 2016. (Year: 2016).*

(Continued)

*Primary Examiner* — Ryan Johnson
(74) *Attorney, Agent, or Firm* — Lando & Anastasi, LLP

(57) ABSTRACT

According to certain aspects of the disclosure, an uninterruptible power supply is provided comprising an input, a backup power supply, an output configured to provide output power from the input and/or the backup power supply, a sensor, a relay, and a controller coupled to the sensor and the relay and being configured to determine, based on stored relay specifications, a manufacturer total estimated relay lifetime, receive operational information indicative of operational parameters of operation of the relay from the sensor, the operational information including a current conducted by the relay, determine, based on the operational information, an effective number of relay cycles consumed by the operation of the relay, determine a modified number of remaining relay cycles based on a difference between the manufacturer total estimated lifetime and the effective number of relay cycles consumed, and output remaining relay lifetime information indicative of the modified number of remaining relay cycles.

20 Claims, 17 Drawing Sheets

(51) Int. Cl.
  *G01R 31/40* (2020.01)
  *H02M 3/04* (2006.01)
  *H02M 7/44* (2006.01)

(58) Field of Classification Search
  CPC ... G01R 31/3271; G01R 31/327; G01R 31/42
  See application file for complete search history.

(56) References Cited

FOREIGN PATENT DOCUMENTS

| EP | 2574946 A1 | * | 4/2013 | ........... G01R 31/327 |
|---|---|---|---|---|
| JP | H0511277 U | | 2/1993 | |
| KR | 20170062739 A | | 6/2017 | |
| KR | 102034209 B1 | | 10/2019 | |

OTHER PUBLICATIONS

Extended European Search Report from corresponding European Application No. 21154241.0 dated May 17, 2021.

* cited by examiner

UNINTERRUPTIBLE POWER SUPPLY COMPONENT ANALYSIS SYSTEM AND METHOD

CROSS-REFERENCE TO RELATED APPLICATIONS

This application claims priority under 35 U.S.C. § 119 to Indian Patent Application Serial No. 202011004304, titled "UNINTERRUPTIBLE POWER SUPPLY COMPONENT ANALYSIS SYSTEM AND METHOD," filed on Jan. 31, 2020, which is hereby incorporated by reference in its entirety.

BACKGROUND

1. Field of the Disclosure

At least one example in accordance with the present disclosure relates generally to uninterruptible power supplies.

2. Discussion of Related Art

The use of power devices, such as uninterruptible power supplies (UPSs), to provide regulated, uninterrupted power for sensitive and/or critical loads, such as computer systems and other data processing systems, is known. Known UPSs include online UPSs, offline UPSs, line-interactive UPSs, as well as others. Online UPSs provide conditioned AC power as well as back-up AC power upon interruption of a primary source of AC power. Offline UPSs typically do not provide conditioning of input AC power, but do provide back-up AC power upon interruption of the primary AC power source.

SUMMARY

According to at least one aspect of the present disclosure, an uninterruptible power supply comprising an input configured to receive input power, a backup power supply configured to output backup power, an output configured to be coupled to at least one load, and configured to provide output power from at least one of the input or the backup power supply to the at least one load, at least one sensor, at least one relay, and a controller coupled to the at least one sensor and to the at least one relay, the controller being configured to determine, based on stored relay specifications, a manufacturer total estimated relay lifetime, receive operational information indicative of operational parameters of operation of the at least one relay from the at least one sensor, the operational information including a current conducted by the at least one relay, determine, based on the operational information, an effective number of relay cycles consumed by the operation of the at least one relay, determine a modified number of remaining relay cycles, the modified number of remaining relay cycles being based on a difference between the manufacturer total estimated lifetime and the effective number of relay cycles consumed, and output remaining relay lifetime information indicative of the modified number of remaining relay cycles.

In some examples, the uninterruptible power supply further comprises a display, wherein the controller is configured to display the remaining relay lifetime information on the display. In various examples, the operational parameters include at least one of electrical parameters or environmental parameters. In at least one example, the uninterruptible power supply further comprises a communications interface configured to be communicatively coupled to at least one server, wherein the controller is further configured to provide component information indicative of the at least one relay to the at least one server via the communications interface. In some examples, the component information includes at least one of the remaining relay lifetime information, the operational information, or the stored relay specifications.

In various examples, in determining the manufacturer total estimated relay lifetime, the controller is further configured to retrieve manufacturer-supplied information indicative of an estimated total lifetime of the at least one relay at a test relay load current and a test relay temperature, and determine, based on the manufacturer-supplied information, an initial remaining lifetime of the at least one relay. In at least one example, the controller is further configured to identify a load type of a load of the at least one relay responsive to identifying a switching event of the at least one relay, wherein the load type includes at least one of a resistive load type, a capacitive load type, or an inductive load type, and wherein the switching event includes at least one of the at least one relay switching from a conducting state to a non-conducting state or from a non-conducting state to a conducting state.

In some examples, identifying the load type includes acquiring electrical parameter samples including at least one of a plurality of current samples or a plurality of voltage samples of the at least one relay, and determining the load type based on one or more of identifying a pattern match between the electrical parameter samples and a reference pattern corresponding to a known load type, determining that the electrical parameter samples are stable within a threshold range of values, or determining a phase difference between the plurality of voltage samples and the plurality of current samples. In various examples, the controller is further configured to receive, from the at least one sensor, at least one current sample indicative of a current through the at least one relay, and receive, from the at least one sensor, at least one temperature sample indicative of a temperature of the at least one relay.

In at least one example, the controller is further configured to determine a current stress factor of the at least one relay based on a difference between the at least one current sample indicative of the current through the at least one relay and the test relay load current, and determine a temperature stress factor of the at least one relay based on a difference between the at least one temperature sample indicative of the temperature of the at least one relay and the test relay temperature. In various examples, the controller is further configured to determine a degradation rate of the at least one relay based on the current stress factor and the temperature stress factor. In some examples, the controller is further configured to determine, based on the degradation rate, an effective number of switching cycles consumed by the switching event, and determine, based on a difference between the estimated total lifetime and the effective number of switching cycles consumed by the switching event, the remaining lifetime of the at least one relay.

According to at least one aspect, a component analysis system is provided comprising at least one computing device communicatively coupled to a plurality of uninterruptible power supplies, the plurality of uninterruptible power supplies including a plurality of relays, the at least one computing device being configured to receive a respective manufacturer total estimated relay lifetime for each relay of the plurality of relays, receive respective operational information indicative of operational parameters of operation of each relay of the plurality of relays, determine, for each relay based on the respective operational information, a respective effective number of relay cycles consumed by operation of the respective relay, determine, for each relay, a modified number of remaining relay cycles based on a difference between the respective manufacturer total estimated lifetime and the respective effective number of relay cycles consumed, determine, based on the modified number of remaining relay cycles for each relay of the plurality of relays, relay lifetime prognostic information indicative of a remaining lifetime of the plurality of relays, and output the relay lifetime prognostic information.

In various examples, the operational parameters include at least one of electrical parameters or environmental parameters. In at least one example, the at least one computing device is further configured to provide the modified number of remaining relay cycles for a respective relay to a respective uninterruptible power supply that includes the respective relay. In some examples, the relay lifetime prognostic information includes at least one of information indicative of a remaining lifetime of each relay of the plurality of relays, information indicative of an expected failure time of each relay of the plurality of relays, information indicative of a load type of each relay of the plurality of relays, information indicative of a remaining lifetime of each relay of the plurality of relays based on a corresponding manufacturer, information indicative of aging over time of each relay of the plurality of relays, or information indicative of a number of failures of failed relays based on a corresponding type of implementation.

According to at least one aspect, a non-transitory computer-readable medium storing thereon sequences of computer-executable instructions for operating an uninterruptible power supply including at least one sensor and at least one relay is provided, the sequences of computer-executable instructions including instructions that instruct at least one processor to determine, based on stored relay specifications, a manufacturer total estimated relay lifetime, receive operational information indicative of operational parameters of operation of the at least one relay, determine, based on the operational information, an effective number of relay cycles consumed by the operation of the at least one relay, determine a modified number of remaining relay cycles, the modified number of remaining relay cycles being based on a difference between the manufacturer total estimated lifetime and the effective number of relay cycles consumed, and output remaining relay lifetime information indicative of the modified number of remaining relay cycles.

In various examples, the operational parameters include at least one of electrical parameters and environmental parameters. In at least one example, the uninterruptible power supply further includes a communications interface configured to be communicatively coupled to at least one server, wherein the instructions are further configured to instruct the at least one processor to provide component information indicative of the at least one relay to the at least one server via the communications interface. In some examples, the component information includes at least one of the remaining relay lifetime information, the operational information, or the stored relay specifications.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
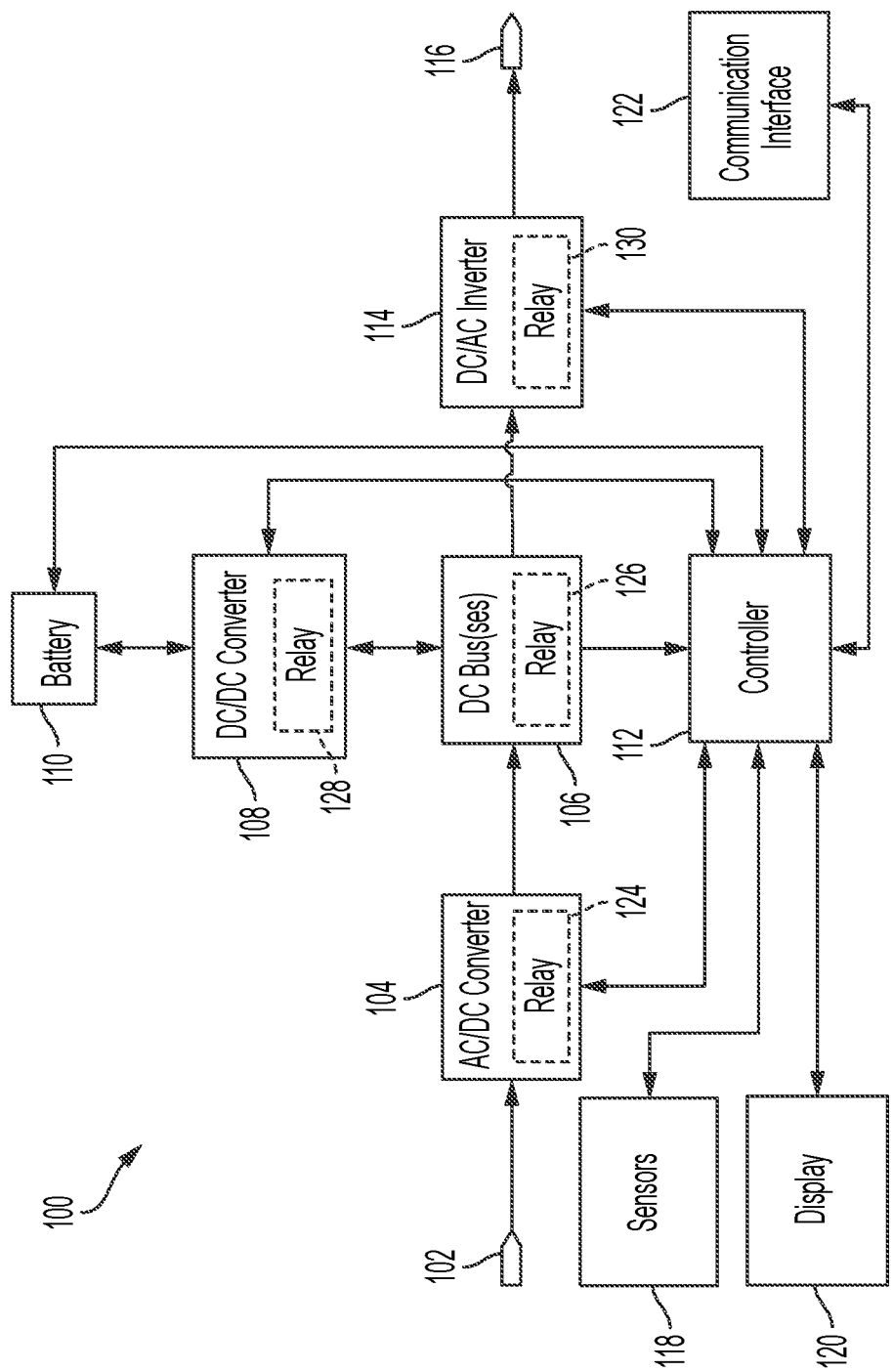
FIG. 1 illustrates a block diagram of an uninterruptible power supply according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including,"

"comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

As discussed above, uninterruptible power supplies (UPSs) may be implemented to provide regulated, uninterrupted power for sensitive and/or critical loads. UPSs include various components including, for example, relays, capacitors, energy storage devices, and so forth. UPS components may have finite lifetimes, after which the components may fail partially or completely and consequently may not operate in an optimal manner. If one or more components of a UPS fails, the UPS may be unable to operate effectively or, in some cases, at all. Accordingly, it may be advantageous to replace components near an end-of-life to avoid situations in which the components fail while the UPS is in operation. However, replacing components too early may disadvantageously result in increased component costs.

Manufacturers of UPS components may include component lifetime estimation specifications with a manufacturer data sheet to aid users in estimating a remaining component lifetime. For example, a manufacturer of a relay may include, in a manufacturer data sheet, an estimated lifetime of the relay. The estimated lifetime may be expressed as a specified number of switching cycles for a specified set of operation parameters (for example, for a specified temperature, current, voltage, power, and so forth). A user may estimate operational parameters of the relay, and use the estimated operation parameters to estimate a lifetime of the relay based on the manufacturer data sheet.

However, an estimated lifetime derived from the manufacturer data sheet may be incomplete and/or inaccurate. For example, because a manufacturer data sheet is unlikely to provide an estimated lifetime of the relay for every possible combination of operational parameters, the manufacturer data sheet is likely incomplete. Furthermore, because the relay may be exposed to various combinations of operational parameters over the lifetime of the relay, an estimate derived from the manufacturer data sheet may be inaccurate because the estimate may be based on an imprecise combination of different lifetime estimates.

In addition to the foregoing deficiencies, determining a remaining lifetime of a relay may be laborious where an operator must manually determine various operation parameters specified by the manufacturer data sheet and manually estimate a remaining lifetime based on the operation parameters and the manufacturer data sheet. Because determining the remaining lifetime may be laborious, operators may be more likely to forego performing frequent remaining lifetime estimations, and err on the side of caution by replacing components earlier than necessary, which leads to increased component costs. Alternatively, operators may not replace components frequently enough, which may lead to undesirable component and/or UPS failures.

Current UPS systems are not typically designed with the capability to automatically and accurately determine a remaining lifetime of UPS components. Thus, current systems may leave a user uncertain about how often to replace UPS components, which may lead to increased costs and equipment failures. This is a technical problem. Examples provided herein provide a technical solution to this technical problem.

An exemplary embodiment of a UPS is provided in which components of one or more UPSs are monitored and analyzed to automatically determine a remaining lifetime of the components. For example, the components of the one or more UPSs may include relays, capacitors, energy storage devices, or other UPS components. A remaining lifetime may be repeatedly determined based on operation parameters to yield a remaining lifetime calculation with minimal or no human interaction. Prognostics may be determined with respect to the components' remaining lifetimes to provide an operator with information that may be used to efficiently manage the components. Accordingly, examples of the disclosure enable device operators to reduce costs associated with component replacement while reducing a likelihood of component failure.

At least this foregoing combination of features comprises a system design that serves as a technical solution to the foregoing technical problem. This technical solution is not routine, is unconventional, and is not well-understood in the field of UPS design. This technical solution is a practical application of the exemplary system at least because the technical solution solves the foregoing technical problem and constitutes an improvement in the technical field of UPS design by providing a UPS configured to make a determination that assists a user with keeping technical equipment operational.

In various aspects, examples are provided with respect to UPS devices including one or more components. As appreciated by one or ordinary skill in the art, UPSs may be implemented in various environments including, for example, data centers. Accordingly, at least one example of a data center is provided for purposes of explanation.

FIG. 1 is a block diagram of a UPS 100. The UPS 100 includes an input 102, an AC/DC converter 104, one or more DC busses 106, a DC/DC converter 108, a battery 110, a controller 112, a DC/AC inverter 114, an output 116, sensors 118, a display 120, and a communication interface 122. The AC/DC converter 104 optionally includes at least one relay 124, the one or more DC busses 106 optionally include at least one relay 126, the DC/DC converter 108 optionally includes at least one relay 128, and the DC/AC inverter 114 optionally includes at least one relay 130.

The input 102 is electrically coupled to the AC/DC converter 104 and is configured to be electrically coupled an AC power source (not pictured), such as an AC mains power supply. The AC/DC converter 104 is electrically coupled to the input 102 and to the one or more DC busses 106, and is communicatively coupled to the controller 112. The one or more DC busses 106 are electrically coupled to the AC/DC converter 104, the DC/DC converter 108, and to the DC/AC inverter 114, and are communicatively coupled to the controller 112.

The DC/DC converter 108 is electrically coupled to the one or more DC busses 106 and to the battery 110, and is communicatively coupled to the controller 112. The battery 110 is electrically coupled to the DC/DC converter 108, and is communicatively coupled to the controller 112. The controller 112 is communicatively coupled to the AC/DC converter 104, the one or more DC busses 106, the DC/DC converter 108, the battery 110, the DC/AC inverter 114, the sensors 118, the display 120, and the communication interface 122. The DC/AC inverter 114 is electrically coupled to the one or more DC busses 106 and to the output 116, and is communicatively coupled to the controller 112. The output 116 is electrically coupled to the DC/AC inverter 114, and may be electrically coupled to an external load (not pictured).

The sensors 118 are communicatively coupled to the controller 112. In some examples, the sensors 118 may be coupled to one or more of the components 104-110 and 114. For example, the sensors 118 may be configured to sense one or more parameters of one or more of the components 104-110 and 114, as discussed in greater detail below. For example, the sensors 118 may include one or more voltage, current, or power sensors coupled to one or more of the components 104-110 and 114 to sense electrical characteristics thereof. The display 120 is communicatively coupled to the controller 112. The communication interface 122 is communicatively coupled to the controller 112, and may be communicatively coupled to one or more external devices (for example, via a wired or wireless connection). For example, the communication interface 122 may include an antenna configured to transduce current signals into electromagnetic signals and vice versa.

The input 102 is configured to be electrically coupled to an input power source, such as an AC mains power source, to receive input AC power having an input voltage level. The UPS 100 is configured to operate in different modes of operation based on the input voltage level of the AC power provided to the input 102. When AC power provided to the input 102 is acceptable (for example, by having parameters, such as an input voltage value, that meet specified criteria, such as falling within a range of acceptable voltage values), the UPS 100 operates in a normal mode of operation. In the normal mode of operation, AC power received at the input 102 is provided to the AC/DC converter 104. The AC/DC converter 104 converts the AC power into DC power and provides the DC power to the one or more DC busses 106. For example, converting the AC power may include modulating, by the AC/DC converter 104, a switching state of the optional at least one relay 124. The one or more DC busses 106 distribute the DC power to the DC/DC converter 108 and to the DC/AC inverter 114, which may include modulating a switching state of the optional at least one relay 126. The DC/DC converter 108 converts the received DC power and provides the converted DC power to the battery 110 to charge one or more backup power supplies, including the battery 110, which may include modulating a switching state of the optional at least one relay 128. The DC/AC inverter 114 receives DC power from the one or more DC busses 106, converts the DC power into regulated AC power, and provides the regulated AC power to the output 116 to be delivered to a load, which may include modulating a switching state of the optional at least one relay 130.

The display 120 may display information indicating that the UPS 100 is operating in the normal mode of operation in addition to other operation information including, for example, voltage information, power information, current information, and so forth. The communication interface 122 may similarly output one or more communications indicating that the UPS 100 is operating in the normal mode of operation in addition to other operation information including, for example, voltage information, power information, current information, and so forth. For example, the communication interface 122 may include a wireless communication interface (including, for example, an antenna), a wired communication interface (including, for example, at least one wired communication port), or a combination of both, configured to provide UPS information to one or more external devices, such as user devices, external servers, and so forth.

When AC power provided to the input 102 from the AC mains power source is not acceptable (for example, by having parameters, such as input voltage values, that do not meet specified criteria), the UPS 100 operates in a backup mode of operation. In the backup mode of operation, DC power is discharged from a backup power supply of the UPS 100. For example, DC power may be discharged from the battery 110 to the DC/DC converter 108. The DC/DC converter 108 converts the received DC power and distributes the DC power amongst the one or more DC busses 106. For example, the DC/DC converter 108 may evenly distribute the power amongst the one or more DC busses 106. The one or more DC busses 106 provide the received power to the DC/AC inverter 114. The DC/AC inverter 114 receives the DC power from the one or more DC busses 106, converts the DC power into regulated AC power, and provides the regulated AC power to the output 116.

The display 120 may display information indicating that the UPS 100 is operating in the backup mode of operation in addition to other operation information including, for example, voltage information, power information, current information, and so forth. The communication interface 122 may similarly output one or more communications indicating that the UPS 100 is operating in the backup mode of operation in addition to other operation information including, for example, voltage information, power information, current information, and so forth. For example, the communication interface 122 may include a wireless communication interface (including, for example, an antenna), a wired communication interface (including, for example, at least one wired communication port), or a combination of both, configured to provide UPS information to one or more external devices, such as user devices, external servers, and so forth.

Accordingly, operation of the UPS 100 may vary depending on a mode of operation of the UPS 100 which, in turn, may depend on certain parameters of the UPS 100 such as input voltage values. For example, the sensors 118 may include one or more voltage sensors configured to sense an input voltage received at the input 102 and provide sensor information indicative of the sensed voltage to the controller 112. The controller 112 may determine a mode of operation of the UPS 100 based on the sensor information received from the sensors 118, and control operation of the UPS 100 accordingly. Feedback indicative of the mode of operation and/or other operation information may be provided to one or more users via the display 120 and/or the communication interface 122.

The sensors 118 may include alternate or additional sensors configured to sense alternate or additional parameters. For example, the sensors 118 may be configured to sense an ambient temperature, a current through one or more components of the UPS 100, a voltage across one or more components of the UPS 100, and so forth. The sensors 118 may provide the sensor information indicative of the sensed parameters to the controller 112. The controller 112 may determine properties of the UPS 100 based at least in part on the sensor information, and provide feedback indicative of the properties of the UPS 100 to one or more users via the display 120 and/or the communication interface 122.

For example, the controller 112 may determine a remaining lifetime of one or more components of the UPS 100 based at least in part on the sensor information. In various examples, a component may include a relay device having a lifetime expressed as a number of remaining cycles. The controller 112 may provide feedback as to the remaining lifetime to one or more users via the display 120 and/or the communication interface 122. Each of the components 104-110 and 114 may include one or more components having a finite lifetime including, for example, relays, capacitors, energy storage devices, and so forth. For example, and as discussed above, the AC/DC converter 104 may optionally include the at least one relay 124, the one or more DC busses 106 may optionally include at least one relay 126, the DC/DC converter 108 may optionally include at least one relay 128, and the DC/AC inverter 114 may optionally include at least one relay 130. The controller 112 may receive, from the sensors 118, sensor information indicative of operating parameters of at least one of the components 104-110 and 114, determine remaining component lifetime information based at least in part on the sensor information, and provide feedback indicative of the remaining component lifetime information to one or more users via the display 120 and the communication interface 122.

Accordingly, in various examples, the UPS 100 may determine a remaining lifetime of one or more components of the UPS 100 having a finite lifetime. The UPS 100 may determine the remaining lifetime and provide information indicative of or pertaining to the remaining lifetime to one or more external devices or users via the display 120 and/or communication interface 122, such that the information may be effectively disseminated to pertinent entities (for example, users operating a data center in which the UPS 100 is implemented). In other examples, discussed in greater detail below, the UPS 100 may provide information that can be used to determine a remaining lifetime of one or more components to another computing device configured to determine the remaining lifetime of the one or more components.

Figure 2:
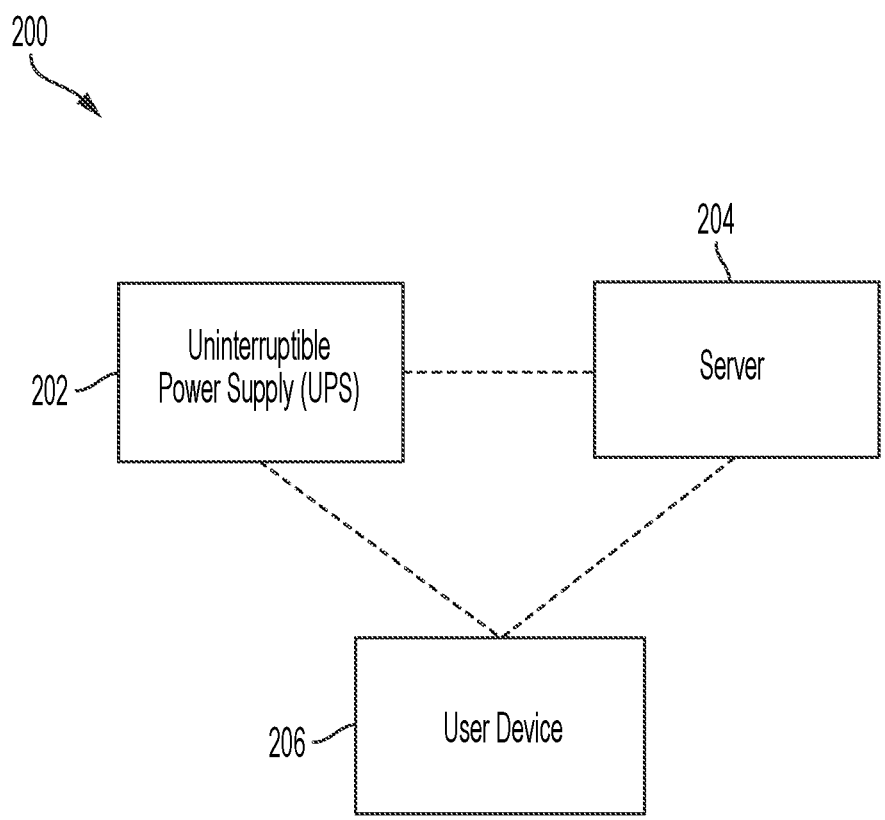
FIG. 2 illustrates a block diagram of a communication system according to an example.

For example, FIG. 2 illustrates a block diagram of a component analysis system 200 according to an example. The component analysis system 200 includes a UPS 202, a server 204, and a user device 206. For example, the UPS 202 may be an example of the UPS 100. Although each of the components 202-206 is identified in singular form for purposes of explanation, each of the components 202-206 may include multiple components. For example, the UPS 202 may include multiple UPSs, the server 204 may include multiple servers, and the user device 206 may include multiple user devices. Accordingly, in some examples, the server 204 may be communicatively coupled to multiple UPSs, including the UPS 202.

The UPS 202 is communicatively coupled to the server 204 and the user device 206 (for example, via the communications interface 102). The server 204 is communicatively coupled to the UPS 202 and the user device 206. The user device 206 is communicatively coupled to the UPS 202 and the server 204. In other examples, fewer communicative connections may be present. For example, the UPS 202 may not be directly communicatively coupled to the user device 206.

The components 202-206 may be remote from one another. For example, where the UPS 202 is implemented in a data center, the server 204 may be external to the data center (for example, by being implemented in a cloud computing environment). In some examples, some or all of the communicative connections between the components 202-206 may be unidirectional or may be bi-directional. For example, the UPS 202 may send and receive communications to and from the server 204 and the user device 206 via a communications interface, such as the communications interface 102. In other examples, the UPS 202 may only send communications to the server 204 and may not receive communications from the server 204.

The UPS 202 may be configured to provide information indicative of, or pertinent to, a remaining lifetime of one or more components of the UPS 202 to one or both of the server 204 and the user device 206 to facilitate dissemination of information to one or more users. For example, the UPS 202 may provide remaining lifetime information to the user device 206 such that a user of the user device 206 may choose whether or not to take corrective action (for example, by replacing a component that is near an end-of-life) based on the remaining lifetime information. In another example, the UPS 202 may provide remaining lifetime information to the server 204 such that the server 204 may determine prognostics based on the remaining lifetime information. The server 204 may subsequently provide the prognostics to a user, such as via the user device 206. In some examples, the server 204 may receive remaining lifetime information from various UPSs, including the UPS 202, and generate prognostic information based on all or a subset of the received remaining lifetime information. In these examples, the prognostic information may include comparative prognostic information comparing components within a single UPS, and/or components of the various UPSs.

Figure 3:
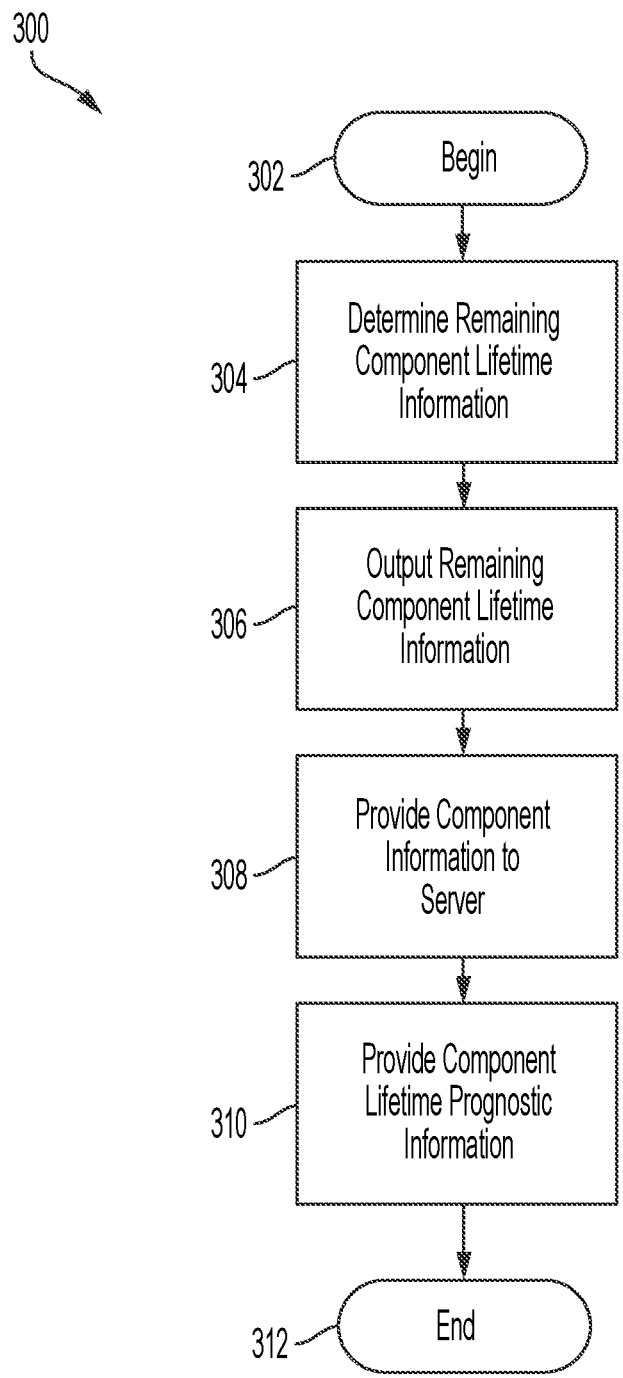
FIG. 3 illustrates a process of operating the communication system according to a first example.

For example, FIG. 3 illustrates a process 300 of operating the component analysis system 200 according to an example. Acts of the process 300 may be performed by all or a subset of the components 202-206.

At act 302, the process 300 begins.

At act 304, remaining component lifetime information is determined. For example, the UPS 202 may determine remaining lifetime information of one or more components of the UPS 202. The one or more components may include one or more of the optional relays 124-130 of the components 104-110 and 114. As discussed in greater detail below with respect to FIGS. 6A-6B, the UPS 202 may execute the determination based on various operational information received from one or more sensors, such as the sensors 118, indicative of operational parameters of the one or more components. For example, the operational parameters indicated by the operational information may include electrical parameters (for example, current, voltage, and so forth) and/or environmental parameters (for example, ambient temperature). The remaining component lifetime information may be expressed depending on a type of the component and/or based on user preferences or configurations. For example, in examples in which the component is a relay, the remaining lifetime information may be expressed as an estimated number of remaining cycles of the relay. As used herein in examples in which the component is a relay, "remaining lifetime information" may include, in addition to or in lieu of the estimated number of remaining cycles of the relay, an estimated amount of remaining operation time of the relay, such as a remaining number of days of operation or a predicted date on which the relay will reach an end-of-life condition.

At act 306, the remaining component lifetime information is output to a user. For example, the UPS 202 may output the remaining component lifetime information to a user via a local display, such as the display 120. In another example, the UPS 202 may output the remaining component lifetime information to the user device 206 in addition to, or in lieu of, outputting the remaining component lifetime information via the local display. The remaining component lifetime information may be expressed in various forms depending on a type of the component and, in some examples, based on user preference. For example, a user may configure the UPS 202 to provide the remaining component lifetime information of a relay as a number of remaining cycles, a number of remaining days of operation, both, or another metric.

At act 308, component information is provided to a server. For example, the UPS 202 may provide the component information to the server 204 and/or other servers. The component information may include the remaining component lifetime information in addition to other information. For example, the component information may include historical information about the component or the UPS 202 (for example, mission profile information relating to historical temperature values, current values, voltage values, power values, and so forth), information used to determine the remaining component lifetime information at act 304 (for example, the operational information), model information of the component, manufacturer-supplied information of the component, and so forth. In other examples, the component information may not include the remaining component lifetime information, but may include the historical information about the component or the UPS 202, the information used to determine the remaining component lifetime information at act 304, the model information of the component, the manufacturer-supplied information of the component, and so forth. The server 204 may determine the remaining component lifetime information based on this component information.

At act 310, component lifetime prognostic information is provided to a user. For example, the server 204 may determine the component lifetime prognostic information based on the received component information, and provide the component lifetime prognostic information to the user device 206 for feedback to a user (for example, via the user device 206). Component lifetime prognostic information may include any information indicative of or relating to a remaining lifetime of one or more components derived from the received component information. In some examples, the component lifetime prognostic information may pertain only to components of the UPS 202, and in other examples, the component lifetime prognostic information may pertain to components of various UPSs.

For example, and as discussed below with respect to FIGS. 8-15, the component lifetime prognostic information may indicate a remaining component lifetime relative to a starting lifetime, a remaining component lifetime relative to a manufacturer's estimations, a remaining lifetime for each component of a specific type, a prediction of certain components expected to fail within various time ranges, a determination of an amount of life consumed segregated by a load type, component lifetime consumed over time, component failures segregated by component type, or other prognostic information. The server 204 may employ one or more techniques to determine the component lifetime prognostic information based on the received component information, such as one or more regression techniques. For example, in determining an expected failure date of a relay component, the server 204 may determine a remaining number of cycles of the relay component and an average historical rate of relay cycle consumption, and determine an expected failure date based on the remaining number of cycles if the relay component continues to be cycled at the average historical rate of relay cycle consumption. In some examples, act 310 may be executed responsive to the user requesting the prognostic information. For example, the user may request certain types of prognostic information from the server 204 via the user device 206. In another example, act 310 may be executed subsequent to act 310 with or without a user input.

At act 312, the process 300 ends.

Figure 4:
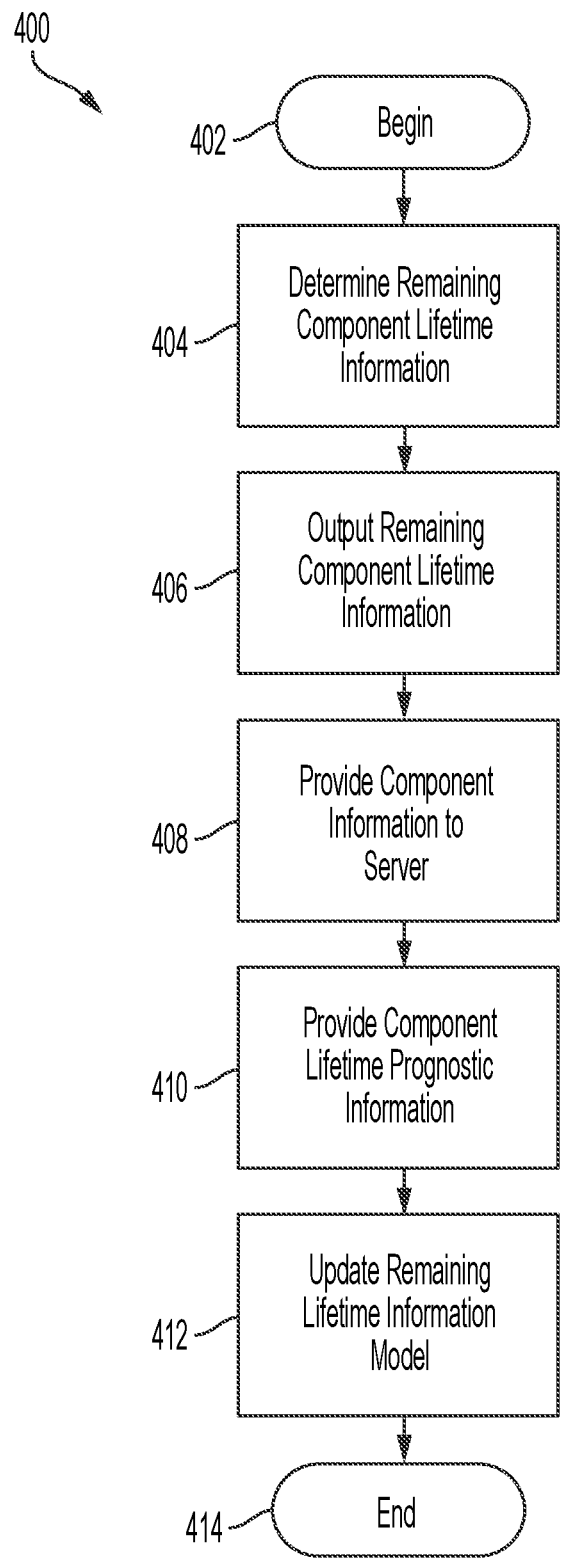
FIG. 4 illustrates a process of operating the communication system according to a second example.

Similar processes of operating the component analysis system 200 are within the scope of the disclosure. For example, FIG. 4 illustrates a process 400 of operating the component analysis system 200 according to another example. The process 400 is similar to the process 300, with an additional act executed. More particularly, acts 402-410 of the process 400 are substantially identical to acts 302-310 of the process 300. After the execution of act 410, which is substantially identical to act 310, the process 400 continues to act 412.

At act 412 of the process 400, a remaining component lifetime model of a UPS is updated. For example, the server 204 may update a remaining component lifetime model of the UPS 202. As discussed above, the server 204 may be coupled to multiple UPSs, which may include the UPS 202. The server 204 may update the remaining component lifetime model of the UPS 202 if the server 204 determines, based on component information received from other UPSs, that component information generated by the UPS 202 may be inaccurate.

At act 414, the process 400 ends.

Figure 5:
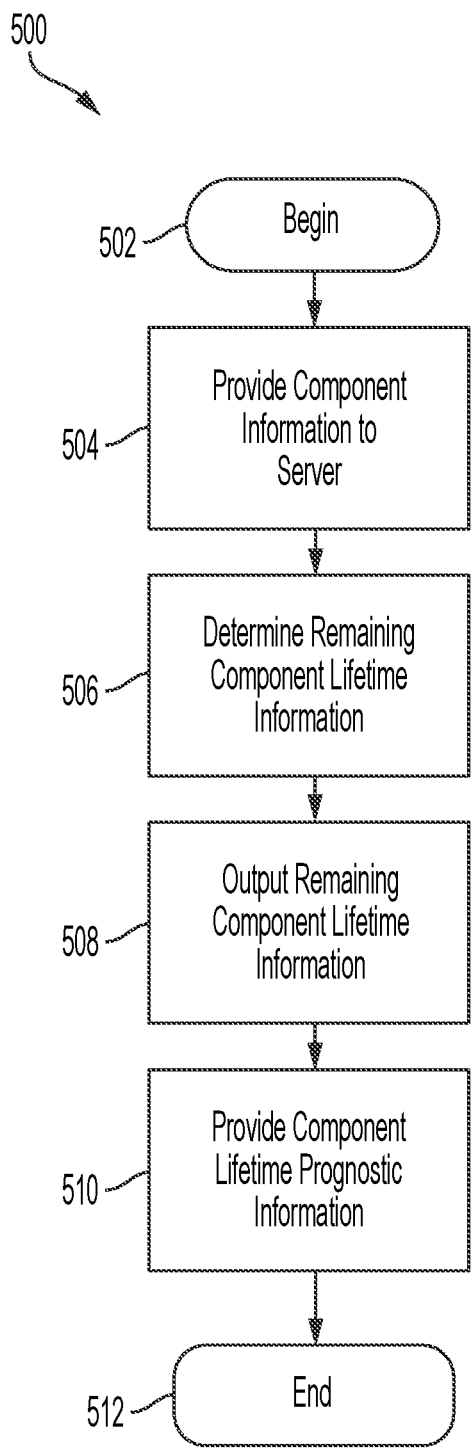
FIG. 5 illustrates a process of operating the communication system according to a third example.

FIG. 5 illustrates a process 500 of operating the component analysis system 200 according to another example. The process 500 is substantially similar to the process 300. However, certain acts of the process 500 are executed by components other than those executing acts of the process 300. More particularly, in the process 500, the server 204 may be configured to determine remaining component lifetime information in lieu of the UPS 202.

At act 502, the process 500 begins.

At act 504, component information is provided to an external server. For example, the UPS 202 may provide component information to the server 204. The component information may include information that may be used to determine remaining component lifetime information, such as electrical parameters and environmental parameters, and other information, such as historical information about the component or the UPS 202 (for example, mission profile information), model information of the component, manufacturer-supplied information of the component, and so forth.

At act 506, remaining component lifetime information is determined by the external server. For example, the server 204 may determine the remaining component lifetime information based on component information received at act 504 including, for example, electrical parameters and environmental parameters and the manufacturer-supplied information. Act 506 may be substantially similar to act 304 and 404, except that the act is executed by the server 204 rather than the UPS 202.

At act 508, remaining component lifetime information is output. For example, the server 204 may output the remaining component lifetime information to the user device 206 for feedback to a user. In another example, the server 204 may provide the remaining component lifetime information to the UPS 202, and the UPS 202 may display the remaining component lifetime information on a local display, for example, such as the display 120.

Act 510 is substantially identical to act 310.

At act 512, the process 500 ends.

In various examples, the processes 300, 400, and 500 may further include validating, by the server 204, a model implemented by a respective UPS, such as the UPS 202, used to determine first remaining component lifetime information. For example, the server 404 may analyze respective remaining component lifetime information provided by each of a plurality of UPSs, including the UPS 202, to validate the model implemented by the UPS 202 to determine the first remaining component lifetime information.

Accordingly, various processes, such as the processes 300, 400, and 500, may be executed with respect to the component analysis system 200. More particularly, processes may be executed to automatically determine remaining component lifetime information of various components of the UPS 202, and generate prognostic information based thereon such that an operator of the UPS 202 may operate the UPS 202 more efficiently. An example of determining remaining component lifetime information (for example, as discussed above with respect to acts 304, 404, and 506) is provided with respect to FIGS. 6A-6B.

Figure 6A:
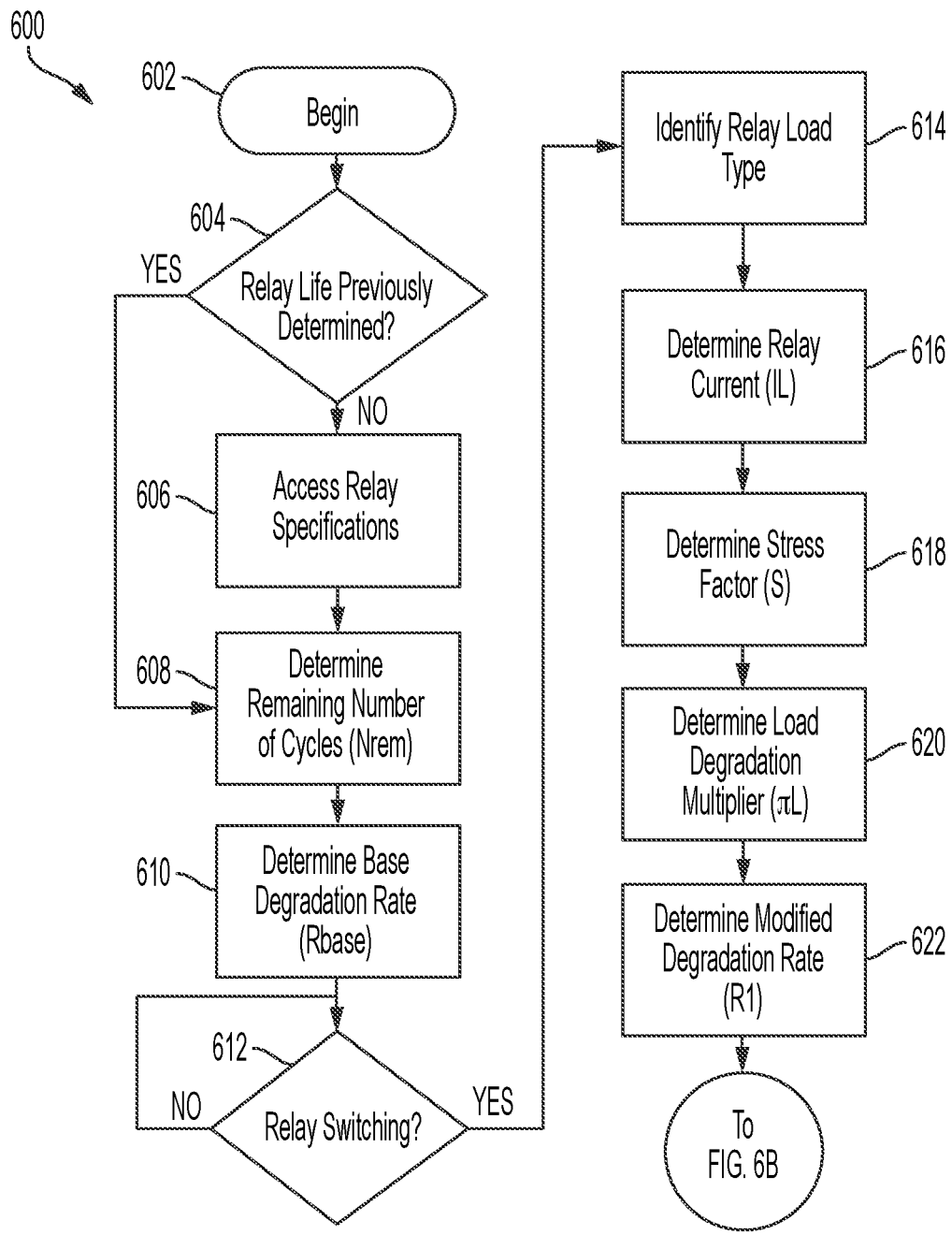
FIGS. 6A-6B illustrate a process of determining remaining component lifetime information according to an example.
Figure 6B:
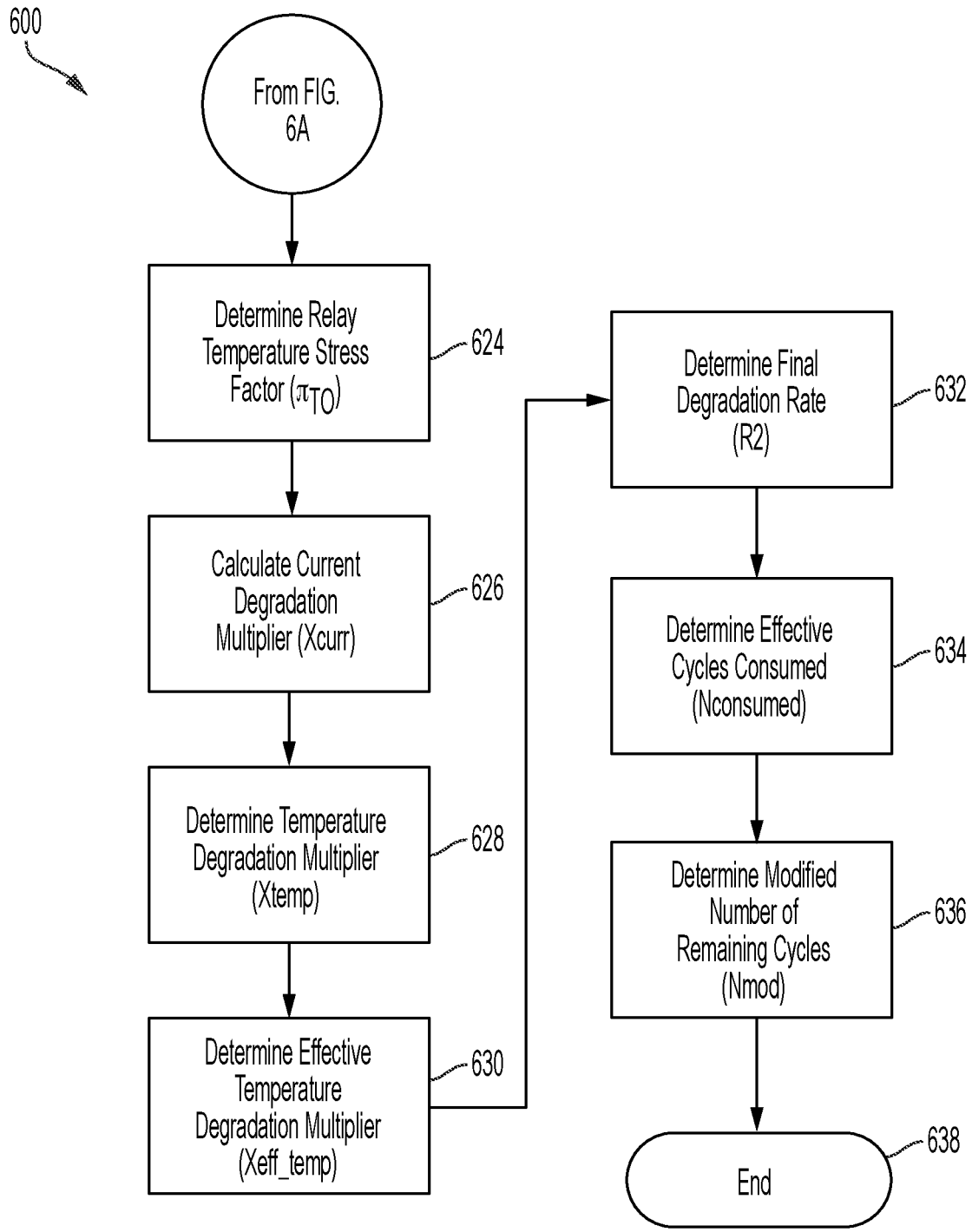

FIGS. 6A-6B illustrate a process 600 of determining remaining component lifetime information according to an example. For purposes of illustration only, the process 600 provides an example in which a component for which remaining component lifetime information is determined includes a relay. However, it is to be appreciated that the principles of the disclosure are applicable to other components including, for example, capacitors, energy storage devices, and so forth. For example, the process 600 may be executed by the UPS 202 (for example, by a controller, such as the controller 112, of the UPS 202) to determine remaining component lifetime pertaining to one or more relays of the UPS 202.

At act 602, the process 600 begins.

At act 604, a determination is made as to whether a remaining life of a relay under examination has previously been determined. For example, a determination may be made by the UPS 202 as to whether the UPS 202 has previously executed the process 600 with respect to the relay under examination. If a remaining life of the relay under examination has previously been performed (604 YES), then the process 600 continues to act 608. Otherwise, if a remaining life of the relay under examination has not been previously performed (604 NO), then the process 600 continues to act 606.

At act 606, relay specifications are accessed or retrieved. For example, relay specifications may include manufacturer specifications. As discussed above, manufacturers may provide manufacturer data sheets with manufacturer components, such as relays. Manufacturer data sheets may include various manufacturer-supplied information including, for example, a manufacturer total estimated component lifetime (for example, a manufacturer total estimated relay lifetime expressed as a number of relay switching cycles) at controlled operation parameters. For example, a manufacturer data sheet may include an estimated total relay lifetime as a number of cycles at one or more specified test currents and/or temperatures. Estimated component lifetime from a manufacturer data sheet may be stored by a device in which the relay is implemented. For example, manufacturer specifications pertaining to an estimated component lifetime may be stored in firmware of the UPS 202. In various examples, therefore, act 606 may include accessing firmware to determine a manufacturer total estimated relay lifetime as a number of cycles ($N_{test}$) at a test temperature ($T_{test}$) and a test current ($I_{test}$).

At act 608, an initial remaining number of cycles ($N_{rem}$) is determined. For example, the initial remaining number of cycles $N_{rem}$ may be set to a most-recently determined number of remaining cycles, as discussed in greater detail below with respect to act 636, if a remaining life of the relay under examination has previously been performed (604 YES). That is, if the process 600 proceeded to act 608 from act 604, the initial remaining number of cycles $N_{rem}$ may be set to the most-recently determined number of remaining cycles. Alternatively, the initial remaining number of cycles $N_{rem}$ may be set to the manufacturer total estimated relay lifetime $N_{test}$ if the process 600 has not been previously executed with respect to a relay under examination (604 NO), that is, if the process 600 proceeded to act 608 from act 606.

At act 610, a base degradation rate $R_{base}$ is determined. The base degradation rate $R_{base}$ may indicate a degradation rate of the relay based on the initial remaining number of cycles $N_{rem}$. In various examples, the base degradation rate $R_{base}$ is set to be equal to a reciprocal of the initial remaining number of cycles $N_{rem}$.

At act 612, a determination is made as to whether a relay switching event has occurred. For example, a controller of the UPS 202, such as the controller 112, may control switching operation of a relay in operating the UPS 202 and therefore determine if the controller has switched the relay. A switching event being determined to have occurred may depend on a switching state of the relay. For example, a switching event may be determined to have occurred only if the relay switches from an off (that is, open and non-conducting) state to an on (that is, closed and conducting) state or vice versa. Alternatively, a switching event may be determined to occur regardless of which state the relay transitions into. If a switching event is determined not to have occurred (612 NO), then the process 600 returns to act 612, which may be executed repeatedly (for example, continuously, periodically, aperiodically, and so forth) until a switching event is determined to have occurred. If a switching event is determined to have occurred (612 YES), then the process 600 continues to act 614.

At act 614, a relay load type is determined. A load type may be categorized as resistive, inductive, capacitive, or a combination of the foregoing. A load may refer to a particular component or set of components of the UPS 202 that the relay provides power to, rather than a load powered by the UPS 202 itself. As discussed in greater detail below with respect to FIGS. 7A-7B, determining a relay load type may be based on current conducted by the relay, a voltage across the relay, or a combination of both.

At act 616, a relay current ($I_L$) is determined. The relay current $I_L$ may be a current conducted by the relay just before, or just after, the switching event detected at act 612. For example, if the relay switching event included the relay transitioning from the off state to the on state, then the relay current $I_L$ may be a current conducted after the switching event. Alternatively, if the relay switching event included the relay transitioning from the on state to the off state, then the relay current $I_L$ may be a current conducted before the switching event.

At act 618, a relay stress factor is determined. The relay stress factor may be indicative of an amount of stress exerted on the relay resulting from the relay current $I_L$ determined at act 616 relative to a manufacturer test current provided in a manufacturer data sheet. For example, the stress factor may be defined as, $$S = \frac{I_L}{I_{test}}$$

where S is a stress factor, $I_L$ is the load current determined at act 616, and $I_{test}$ is the test current derived from a manufacturer data sheet at act 606.

At act 620, a load degradation multiplier ($\pi_L$) is determined. The load degradation multiplier $\pi_L$ is a stress factor calculation based on load type, and is indicative of modifications to the base degradation rate $R_{base}$ based on a load type determined at act 614, and the load current $I_L$. More particularly, the load degradation multiplier $\pi_L$ may be defined for resistive loads as, $$\pi_L = e^{\left(\frac{S}{0.8}\right)^2}$$

where e is the natural exponential function, and S is the stress factor. The load stress factor $\pi_L$ may be defined for an inductive load as, $$\pi_L = e^{\left(\frac{S}{0.4}\right)^2}$$

where e is the natural exponential function, and S is the stress factor. The load stress factor $\pi_L$ may be defined for a capacitive load as, $$\pi_L = e^{\left(\frac{S}{0.2}\right)^2}$$

where e is the natural exponential function, and S is the stress factor. In some examples, a relay may power multiple types of loads. In various examples in which a relay powers multiple types of loads (that is, where multiple relay load types are identified at act 614), a determination may be made as to a load degradation multiplier $\pi_L$ for each type of load that the relay powers, and a worst-case (for example, largest) load degradation multiplier $\pi_L$ may be selected as the load degradation multiplier $\pi_L$ at act 620.

At act 622, a modified degradation rate ($R_1$) is determined. The modified degradation rate $R_1$ is indicative of the base degradation rate $R_{base}$ modified in accordance with the load degradation multiplier $\pi_L$. For example, the modified degradation rate $R_1$ may be determined as, $$R_1 = \pi_L * R_{base}$$

where $R_1$ is the modified degradation rate $R_1$, $\pi_L$ is the load degradation multiplier, and $R_{base}$ is the base degradation rate $R_{base}$.

At act 624, a relay temperature stress factor ($\pi_{TO}$) is determined. The relay temperature stress factor $\pi_{TO}$ may vary based on an ambient temperature of the relay, and based on a junction temperature of the relay, which may increase in proportion with the load current $I_L$ of the relay. For example, the relay temperature stress factor $\pi_{TO}$ may be defined as, $$\pi_{TO} = e^{\left(\frac{-Ea_{op}}{0.00008617}\left(\frac{1}{T_{AO}+T_R+273}-\frac{1}{298}\right)\right)}$$

where $\pi_{TO}$ is a relay temperature stress factor $\pi_{TO}$, e is the natural exponential function, $Ea_{op}$ is an operating activation energy ($Ea_{op}$), $T_{AO}$ is an ambient temperature of the relay, and $T_R$ is a junction temperature rise above the ambient temperature $T_{AO}$.

The operating activation energy $Ea_{op}$ may be a constant, known value corresponding to a type of the relay. For example, the UPS 202 may maintain a mapping of operating activation energy values to relay types and thereby derive the operating activation energy $Ea_{op}$ based on the known relay type. The ambient temperature of the relay $T_{AO}$ may be determined by one or more temperature sensors near the relay, such as one of the sensors 118. The junction temperature rise $T_R$ may be determined based on measurements from one or more temperature sensors near the relay junction, such as one of the sensors 118. In another example, the junction temperature rise $T_R$ may be estimated based on a mapping of default temperature rise values to a relay type and/or load current conducted by the relay.

At act 626, a current degradation multiplier ($X_{curr}$) is determined. The current degradation multiplier $X_{curr}$ may be determined based on a temperature variation between a temperature rise associated with, or caused by, the load current $I_L$, and a temperature rise associated with, or caused by, the test current $I_{test}$. The current degradation multiplier $X_{curr}$ may be set equal to the relay temperature stress factor $\pi_{TO}$ determined at act 624, using values for the ambient temperature of the relay $T_{AO}$ and the junction temperature rise $T_R$ above the ambient temperature $T_{AO}$ that are based on the temperature rise associated with the load current $I_L$ as compared to the test current $I_{test}$.

At act 628, a temperature degradation multiplier ($X_{temp}$) is determined. The temperature degradation multiplier $X_{temp}$ may be calculated based on a temperature variation between an ambient temperature $T_{AO}$ and the test temperature $T_{test}$. The temperature degradation multiplier $X_{temp}$ may be set equal to the relay temperature stress factor $\pi_{TO}$ determined at act 624, using values for the ambient temperature of the relay $T_{AO}$ and the junction temperature rise $T_R$ above the ambient temperature $T_{AO}$ that are based on the temperature rise in the UPS 202.

At act 630, an effective temperature degradation multiplier ($X_{eff\_temp}$) is determined. The effective temperature degradation multiplier $X_{eff\_temp}$ may indicate a cumulative effect of the current degradation multiplier $X_{curr}$ and the temperature degradation multiplier $X_{temp}$. The effective temperature degradation multiplier $X_{eff\_temp}$ may be determined as, $$X_{eff\_temp} = X_{curr} + X_{temp}$$

where $X_{eff\_temp}$ is the effective temperature degradation multiplier $X_{eff\_temp}$, $X_{curr}$ is the current degradation multiplier $X_{curr}$ and $X_{temp}$ is the temperature degradation multiplier $X_{temp}$.

At act 632, a final degradation rate ($R_2$) is determined. The final degradation rate $R_2$ may be indicative of the modified degradation rate $R_1$ further modified by the effective temperature degradation multiplier $X_{eff\_temp}$. For example, the final degradation rate $R_2$ may be determined as, $$R_2 = R_1 * X_{eff\_temp}$$

where $R_2$ is the final degradation rate $R_2$, $R_1$ is the modified degradation rate $R_1$, and $X_{eff\_temp}$ is the effective temperature degradation multiplier $X_{eff\_temp}$.

At act 634, an effective number of relay cycles consumed ($N_{consumed}$) is determined. The effective number of relay cycles consumed $N_{consumed}$ may be indicative of an effective number of switching cycles consumed by the switching event identified at act 612 when parameters including temperature and load current are considered. For example, although the relay may only actually switch once, the effective number of relay cycles consumed $N_{consumed}$ may be greater than one where operating conditions are more demanding than controlled test parameters (for example, by having a higher current or temperature than a test current or test temperature). The effective number of relay cycles consumed $N_{consumed}$ may be equal to the reciprocal of the final degradation rate $R_2$.

At act 636, a modified number of remaining relay cycles ($N_{mod}$) is determined. The modified number of remaining relay cycles $N_{mod}$ may be indicative of a remaining lifetime of the relay expressed as a number of relay cycles remaining. For example, the modified number of remaining relay cycles $N_{mod}$ may be determined as, $$N_{mod} = N_{rem} - N_{consumed}$$

where $N_{mod}$ is the modified number of remaining relay cycles $N_{mod}$, $N_{rem}$ is the remaining number of relay cycles $N_{rem}$ determined at act 608, and $N_{consumed}$ is the effective number of relay cycles consumed $N_{consumed}$ determined at act 634.

At act 638, the process 600 ends.

Accordingly, the process 600 may be executed to determine a more accurate remaining lifetime of a component than would be possible to determine using only a manufacturer data sheet. For example, the process 600 may be executed by the UPS 202 to determine a remaining lifetime of a relay of the UPS 202. The process 600 may yield a remaining lifetime as a number of switching cycles remaining before an end-of-life of the relay. In other examples, the remaining lifetime may be expressed in another form, such as a remaining number of days, weeks, and/or years before an end-of-life of the relay. In various examples, a remaining number of days, weeks, and/or years before an end-of-life may be determined based on the remaining number of switching cycles, and vice versa. For example, a remaining number of days before an end-of-life of the relay may be determined by determining a remaining number of relay switching cycles and an average rate of switching cycle consumption, and determining therefrom a remaining number of days before the remaining number of relay switching cycles is zero. Furthermore, as discussed above, the UPS 202 may be configured to determine a remaining lifetime of other components of the UPS 202.

In various examples, one or more acts of the process 600 may be optionally implemented. For example, in some examples, acts 604, 608-614, and 618-632 may be excluded such that only optional acts 606, 616, 634, and 636 are executed. Acts 606, 616, 634, and 636 may be executed as one example of act 304, for example. In these examples of the process 300 and others, acts 304 and 306 may be optionally executed, and other optional acts of the process 300 (for example, acts 308 and 310) may be excluded.

Figure 7A:
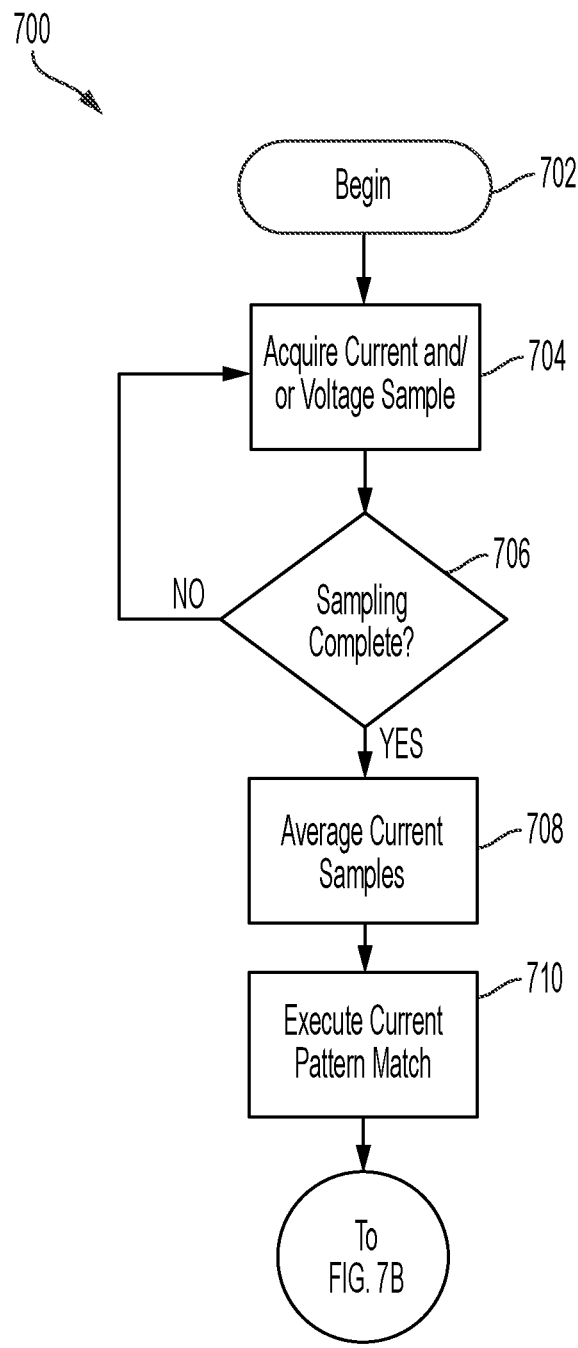
FIGS. 7A-7B illustrate a process of determining a component load type according to an example.
Figure 7B:
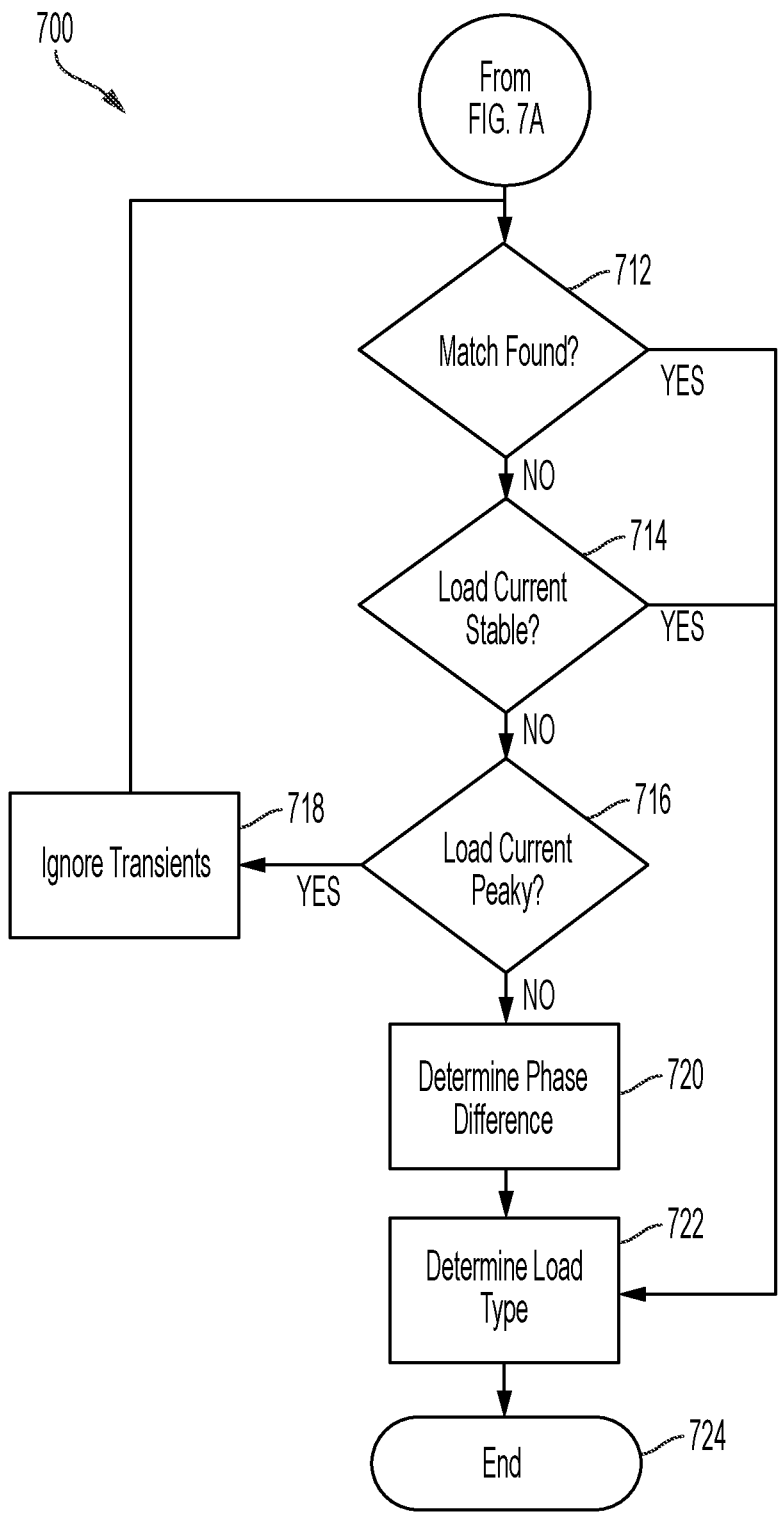

As discussed above with respect to act 614, the UPS 202 may be configured to determine a component load type, such as a relay load type. FIGS. 7A-7B illustrate a process 700 of determining a component load type according to an example, which may be an example of the act 614. For example, the process 700 may be executed by the UPS 202. In other examples, the process 700 may be executed independently of the process 600. For purposes of explanation only, the process 700 provides an example of determining a relay load type.

At act 702, the process 700 begins.

At act 704, current and/or voltage samples are acquired. For example, a current sample may be a current conducted by a relay of the UPS 202, and a voltage sample may be a voltage across the relay. The UPS 202 may include one or more sensors (for example, the sensors 118) configured to determine the current and/or voltage values. As used herein, the term "electrical parameter samples" may include current samples and/or voltage samples.

At act 706, a determination is made as to whether sampling is complete. For example, a determination may be made as to whether a threshold number of samples have been acquired. If sampling is not complete (706 NO), then the process 700 returns to act 704. Acts 704 and 706 may be repeatedly executed (for example, continuously, periodically, aperiodically, and so forth) until sampling is complete. In one example, sampling is performed periodically approximately every 58 μs over the course of approximately 20 ms until 256 samples have been acquired, at which point sampling is complete. If sampling is complete (706 YES), then the process 700 continues to act 708.

At act 708, two or more samples are averaged. For example, two or more of the most-recent electrical parameter samples (for example, ten current samples) may be averaged together. In another example, different groups of samples (for example, every group of five contiguous samples) may be averaged.

At act 710, a pattern match is executed. For example, the UPS 202 may execute a pattern match algorithm to determine if a pattern of the electrical parameter samples matches a reference current pattern corresponding a known load type, such as a known current or voltage pattern of a resistive load, a known current or voltage pattern of an inductive load, or a known current or voltage pattern of a capacitive load.

At act 712, a determination is made as to whether a match has been found from the pattern match executed at act 710. If a match has been found (712 YES), then a load type is known to correspond to the load type of the matching pattern, and the process 700 continues to act 722. Otherwise, if a match has not been found (712 NO), then the process 700 continues to act 714.

At act 714, a determination is made as to whether a load current is stable. For example, the UPS 202 may determine, based on the current samples determined at act 704, if a most-recently acquired group of samples (for example, the last 20 samples) vary by less than a threshold amount from one another. If the samples vary by less than the threshold amount, then the load current may be determined to be stable (714 YES), then the load type may be determined to be resistive. Accordingly, the process 700 proceeds to act 722. Otherwise, if the load current is not stable (714 NO), then the process 700 continues to act 716.

At act 716, a determination is made as to whether a load current is peaky. For example, the UPS 202 may determine, based on the current samples determined at act 704, if the load current intermittently exceeds defined threshold values (for example, by peaking above the threshold values). If the load current is determined to be peaky (716 YES), then the process 700 continues to act 718.

At act 718, responsive to determining that the load current is peaky, the load current samples are ignored as transients. For example, any load current samples exceeding the thresholds may be disregarded. The process 700 may return to act 712 to determine if, without considering the disregarded load current samples, a match is found between the load current and any of the known current patterns.

Returning to act 716, if the load current is determined not to be peaky (716 NO), then the process 700 continues to act 720.

At act 720, a determination is made as to a phase difference between a current sample acquired at act 704 and a voltage sample acquired at act 704. As appreciated by one of ordinary skill in the art, a phase of a current provided to a load leads a phase of a voltage across the load if the load is inductive, and a phase of a current provided to a load lags a phase of a voltage across the load if the load is capacitive. Accordingly, a load type may be determined at act 720 by determining a phase difference between the current and voltage samples acquired at act 704 and determining if the current leads or lags the voltage, and the process 700 continues to act 722.

At act 722, a load type is determined. As discussed above, the process 700 includes various acts (for example, acts 712, 714, and 720) that may result in the process 700 continuing to act 722 because a load type has been determined. For example, a load type may be determined to be resistive, inductive, or capacitive at act 712 where a pattern match is found, causing the process 700 to continue to act 722. Similarly, a load type may be determined to be resistive at act 714 where load current is stable, causing the process 700 to continue to act 722. In another example, a load type may be determined to be inductive or capacitive at act 720 depending on a phase difference between a current and voltage sample, causing the process 700 to continue to act 722.

At act 724, the process 700 ends.

Accordingly, the process 700 may be executed to determine a load type. For example, the UPS 202 may execute the process 700 to determine a relay load type (for example, a resistive type, inductive type, or capacitive type) of a relay of the UPS 202. The UPS 202 may execute the process 700 in connection with the process 600 (for example, as an example of the act 614) or independently of the process 600.

As discussed above with respect to acts 310, 410, and 510, component lifetime prognostic information may be generated based at least in part on component information provided, generated, and/or determined by one or more UPSs, such as the UPS 202. For example, the component lifetime prognostic information may be generated by the server 204 (which may be, for example, a cloud server) based on component information received from the UPS 202.

Component lifetime prognostic information may provide information about one or more components' lifetimes, and may be provided to users to enable the users to make more-informed decisions regarding the components. In some examples, a server such as the server 204 may be communicatively coupled to, and receive component information from, multiple UPSs, including the UPS 202. The server may generate and/or provide component lifetime prognostic information based on component information concerning like components from multiple UPSs.

For example, the server may generate component lifetime prognostic information indicating remaining component lifetime information for multiple relays (for example, multiple relays in the same UPS, or from multiple UPSs). The component lifetime prognostic information indicating information for multiple relays may be particularly beneficial for one or more users receiving the remaining component lifetime information, at least because users may interpret remaining component lifetime information for each relay in the context of other relays. Examples of component lifetime prognostic information that may be generated (for example, at acts 310, 410, and/or 510) will now be provided with respect to FIGS. 8-15.

Figure 8:
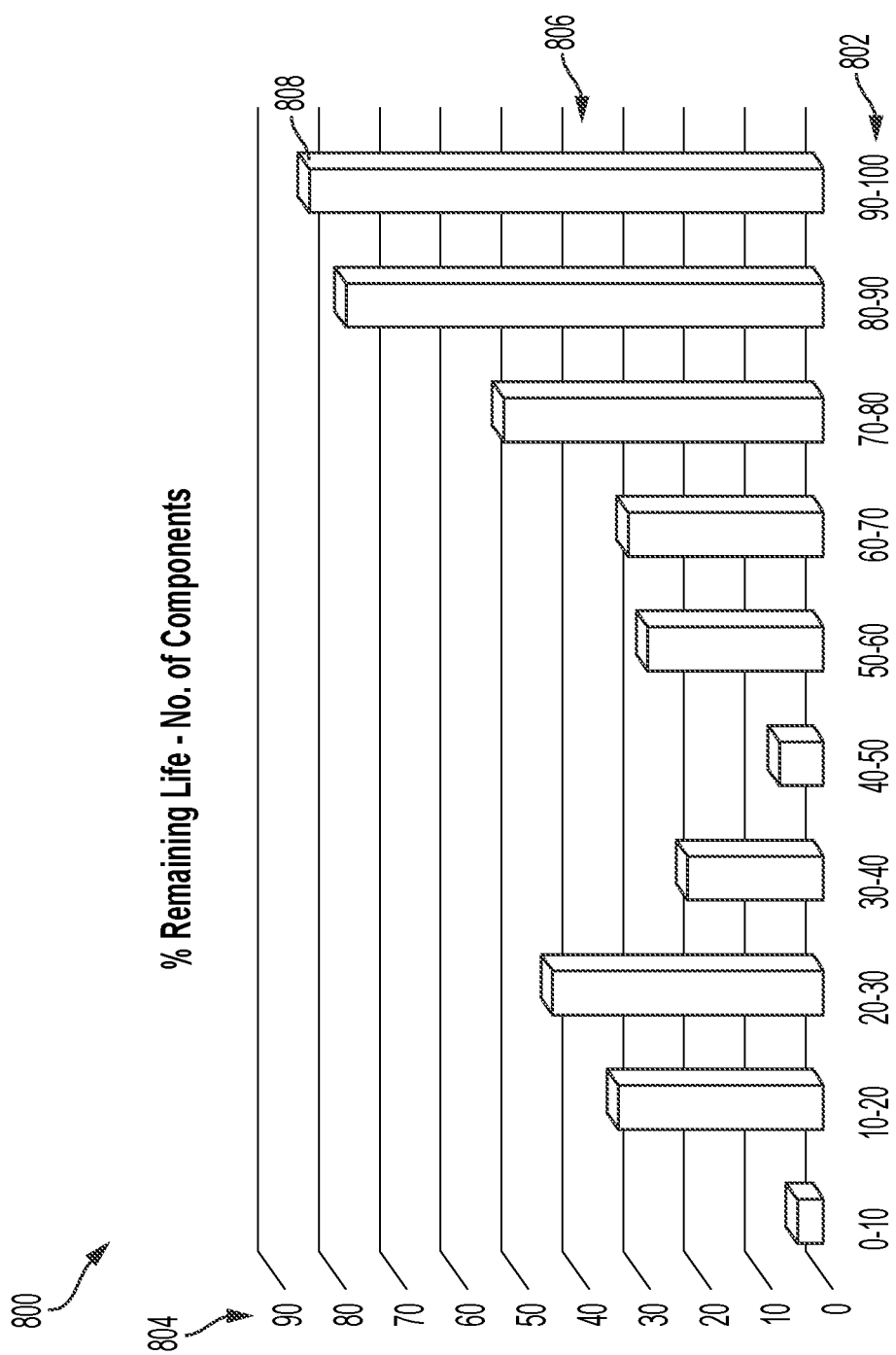
FIG. 8 illustrates a graph of component lifetime prognostic information according to a first example.
Figure 9:
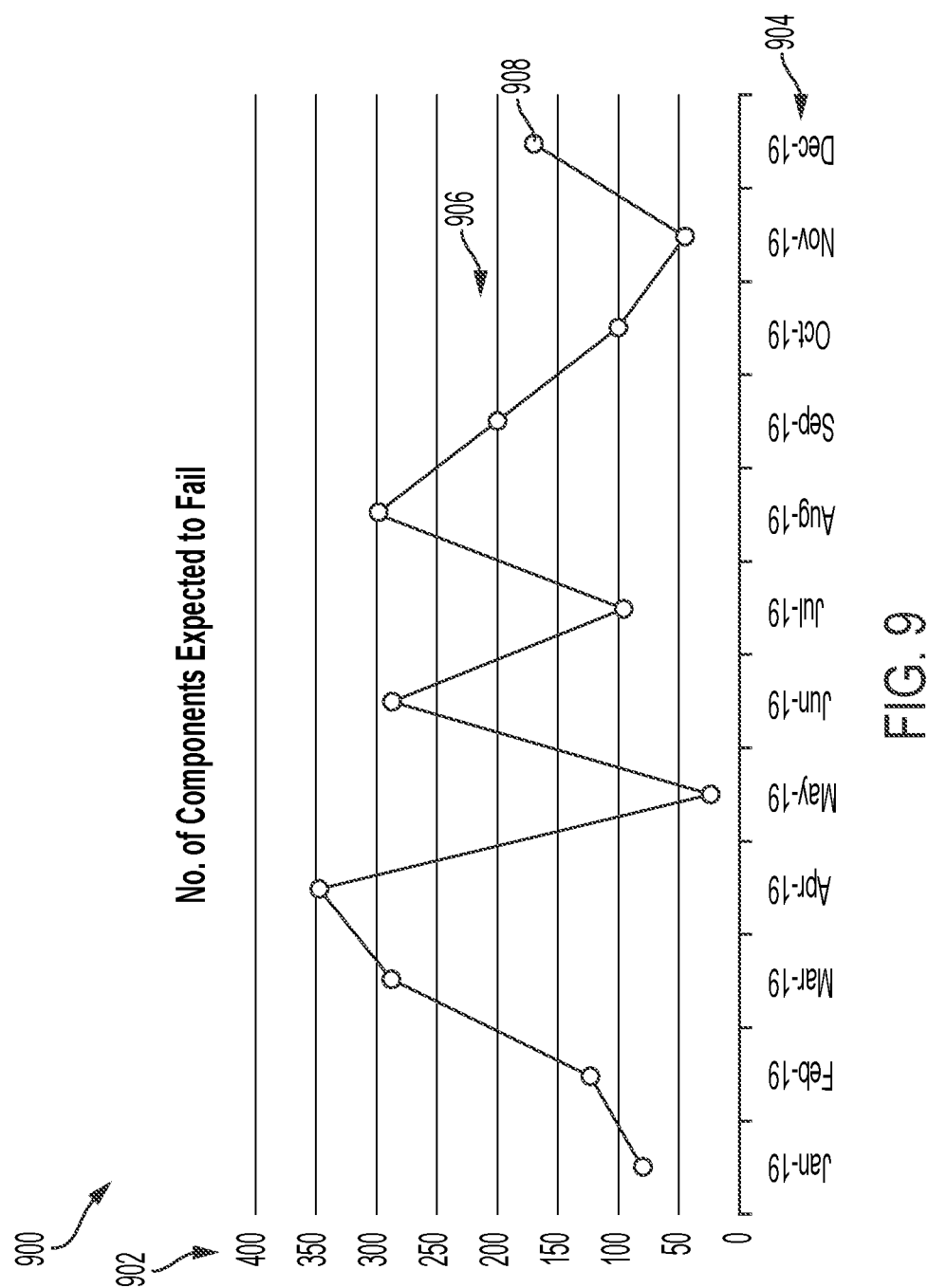
FIG. 9 illustrates a graph of component lifetime prognostic information according to a second example.

FIG. 8 illustrates a graph 800 of component lifetime prognostic information according to a first example. The graph 800 may be generated by a server, such as the server 204, based on information received from multiple devices, including the UPS 202. The server may receive component information from each of the multiple devices over a period of time and generate the graph 800 based on all or a subset of the received component information. For example, the server 204 may be a cloud server configured to receive component information from multiple devices including the UPS 202 pertaining to relay components.

The graph 800 includes an x-axis 802 indicating a remaining percentage of life for a component, a y-axis 804 indicating a number of components corresponding to a respective percentage, and data bars 806 including a data bar 808. The x-axis 802 is partitioned into ranges of percentages (including, for example, 0-10%, 10-20%, and so forth). Each of the data bars 806 corresponds to a respective one of the ranges of percentages. Each of the data bars 806 further indicates a number of components having a remaining lifetime falling within a respective range of lifetime percentage.

For example, the data bar 808 corresponds to the 90-100% remaining percentage of life partition of the x-axis 802. A value of the data bar 808 along the y-axis 804 indicates that slightly more than 80 of the components have between 90% and 100% of remaining life. For example, where the graph 800 is generated based on component information pertaining to relays implemented in devices such as UPSs, the data bar 808 may indicate that slightly more than 80 relays have between 90% and 100% of remaining life.

In other examples, the server 204 may generate graphs similar to the graph 800 based on component information received from any number of devices and pertaining to any type of component, such as relays, capacitors, energy storage devices, and so forth. Although the x-axis 802 is partitioned into particular ranges of percentages, any ranges of percentages may be implemented. Furthermore, other metrics of remaining component lifetime may be implemented in other examples. For example, remaining component lifetime may be expressed in terms of a number of remaining days until an end-of-life, a number of remaining switching cycles (for example, in the context of relays), and so forth.

As discussed above, the server 204 may generate the graph 800. The server 204 may generate the graph 800 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 800 to provide a user with an optimal amount of information.

Furthermore, the period of time over which component information is analyzed may be controlled or configurable. For example, a user may configure or control the server 204 to generate the graph 800 based on component information received over the past day, week, year, or any other time period. In other examples, the server 204 may dynamically determine an optimal period of time to provide a user with an optimal amount of information.

FIG. 900 illustrates a graph 900 of component lifetime prognostic information according to a second example. The graph 900 may be generated by a server, such as the server

204, based on information received from multiple devices, including the UPS 202. The server may receive component information from each of the multiple devices over a period of time and generate the graph 900 based on all or a subset of the received component information. For example, the server 204 may be a cloud server configured to receive component information from multiple devices including the UPS 202 pertaining to relay components.

The graph 900 includes a y-axis 902 indicating a number of components expected to fail in a corresponding time period, an x-axis 904 indicating partitioned time periods, and data points 906 including a data point 808. The x-axis 904 is partitioned into periods of months (including, for example, January 2019, February 2019, and so forth). Each of the data points 906 corresponds to a respective one of the time periods. Each of the data points 906 further corresponds to a number of components expected to fail, as indicated by the y-axis 902, within the corresponding time period.

For example, the data point 908 corresponds to the December 2019 period of the x-axis 904. A value of the data point 908 along the y-axis 902 indicates that approximately 175 of the components are expected to fail in the December 2019 time period. For example, where the graph 900 is generated based on component information pertaining to relays implemented in devices such as UPSs, the data point 908 may indicate that approximately 175 relays are expected to fail in December 2019.

In other examples, the server 204 may generate graphs similar to the graph 900 based on component information received from any number of devices and pertaining to any type of component, such as relays, capacitors, energy storage devices, and so forth. Although the x-axis 904 is partitioned into particular time periods, any time periods may be implemented, such as days, weeks, years, or periods of time not corresponding to calendar time periods (for example, 30- or 31-day periods not aligning with calendar month dates).

Furthermore, while the y-axis 902 may indicate a number of components expected to fail in a corresponding time period in some examples, other metrics may be indicated by the y-axis 902. For example, the y-axis 902 may indicate a number of components that should be replaced in a corresponding time period, even though the components may not necessarily be expected to fail within the corresponding time period. A metric indicated by the y-axis 902 may be configured by a user, for example, or may be dynamically determined by the server 204 to provide an optimal amount of information to a user.

As discussed above, the server 204 may generate the graph 900. The server 204 may generate the graph 900 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 900 to provide a user with an optimal amount of information.

Furthermore, the period of time over which component information is analyzed may be controlled or configurable. For example, a user may configure or control the server 204 to generate the graph 800 based on component information received over the past day, week, year, or any other time period. Similarly, a range of time indicated by the x-axis 904 may be configured by a user. In other examples, the server 204 may dynamically determine an optimal period of time to provide a user with an optimal amount of information.

Figure 10:
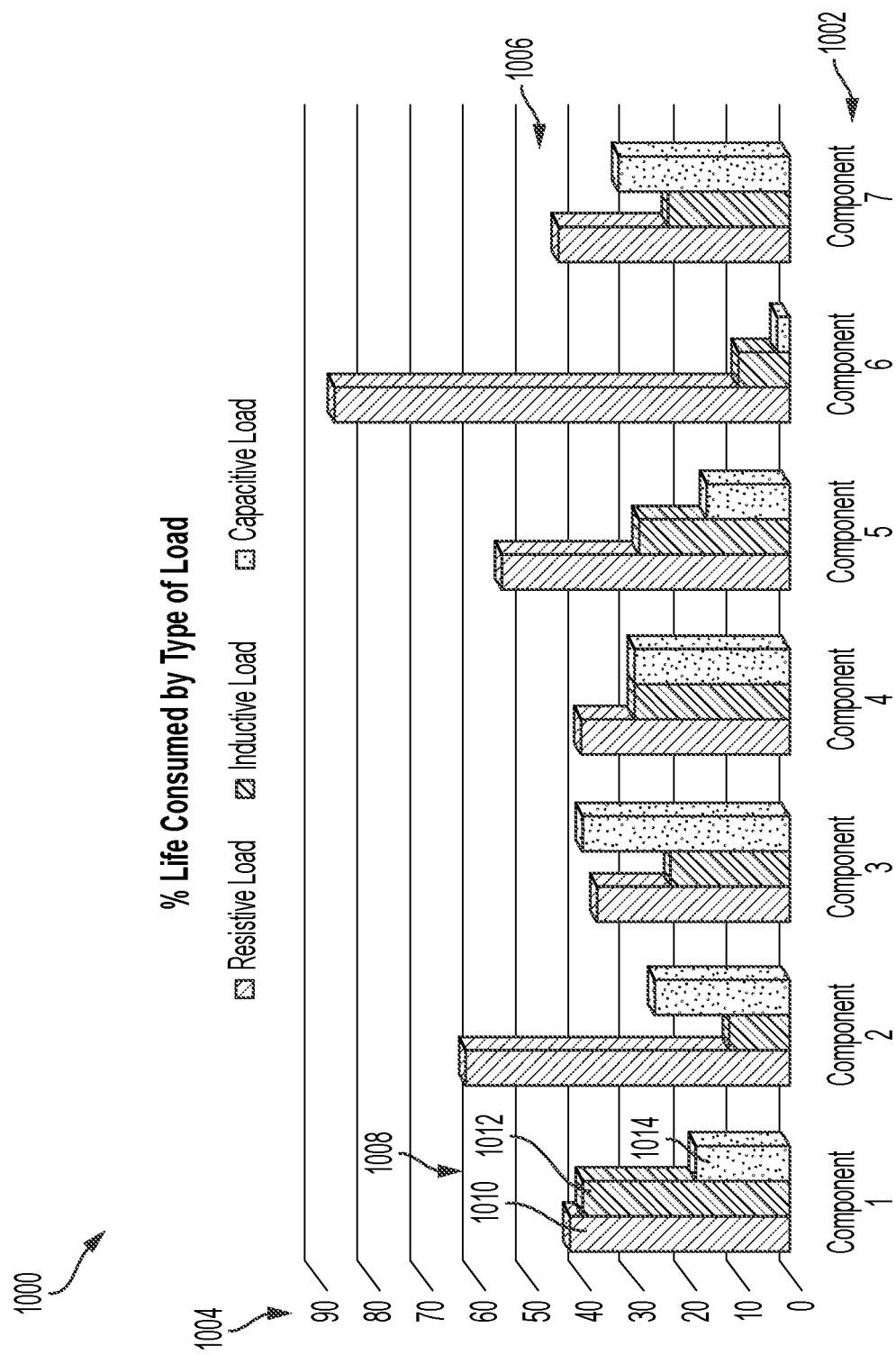
FIG. 10 illustrates a graph of component lifetime prognostic information according to a third example.

FIG. 10 illustrates a graph 1000 of component lifetime prognostic information according to a third example. The graph 1000 may be generated by a server, such as the server 204, based on information received from multiple devices, including the UPS 202. The server may receive component information from each of the multiple devices over a period of time and generate the graph 1000 based on all or a subset of the received component information. For example, the server 204 may be a cloud server configured to receive component information from multiple devices including the UPS 202 pertaining to relay components.

The graph 1000 includes an x-axis 1002 indicating enumerated components, a y-axis 1004 indicating a percentage of lifetime consumed for a corresponding one of the enumerated components, and groups of data bars 1006 including a first group of data bars 1008 corresponding to a first component. Each of the groups of data bars 1006 includes a resistive load data bar indicating a percentage of lifetime consumed for a respective component by a resistive load of the respective component, an inductive load data bar indicating a percentage of lifetime consumed for a respective component by an inductive load of the respective component, and a capacitive load data bar indicating a percentage of lifetime consumed for a respective component by a capacitive load of the respective component.

For example, the first group of data bars 1008 includes a resistive load data bar 1010 indicating a percentage of total lifetime of the first component consumed by a resistive load, an inductive load data bar 1012 indicating a percentage of total lifetime of the first component consumed by an inductive load, and a capacitive load data bar 1014 indicating a percentage of total lifetime of the first component consumed by a capacitive load. More particularly, the resistive load data bar 1010 indicates that approximately 40% of a total lifetime of the first component has been consumed by a resistive load, the inductive load data bar 1012 indicates that approximately 38% of the total lifetime of the first component has been consumed by an inductive load, and the capacitive load data bar 1014 indicates that approximately 16% of the total lifetime of the first component has been consumed by a capacitive load. For example, where the graph 1000 is generated based on component information pertaining to relays implemented in devices such as UPSs, each of the group of data bars 1008 may indicate the types of loads that have consumed various percentages of a total lifetime of a corresponding relay.

In other examples, the server 204 may generate graphs similar to the graph 1000 based on component information received from any number of devices and pertaining to any type of component, such as relays, capacitors, energy storage devices, and so forth. Although the y-axis 1004 may indicate a percentage of a total lifetime of a corresponding component, in other examples, the y-axis 1004 may indicate a percentage of a consumed lifetime of a corresponding component. That is, each of the groups of bars 1006 may indicate a breakdown of the lifetime already consumed for each corresponding component, and thus sum to 100% regardless of a total lifetime consumed for each component.

As discussed above, the server 204 may generate the graph 1000. The server 204 may generate the graph 1000 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1000 to provide a user with an optimal amount of information. In still another example, the server 204 may generate the graph 1000 based on component information received from a single device, such as the UPS 202. For example, the server 204 may generate the graph 1000 based on component information for every relay in the UPS 202.

Furthermore, the period of time over which component information is analyzed may be controlled or configurable. For example, a user may configure or control the server 204 to generate the graph 1000 based on component information received over the past day, week, year, or any other time period. In other examples, the server 204 may dynamically determine an optimal period of time to provide a user with an optimal amount of information.

Figure 11:
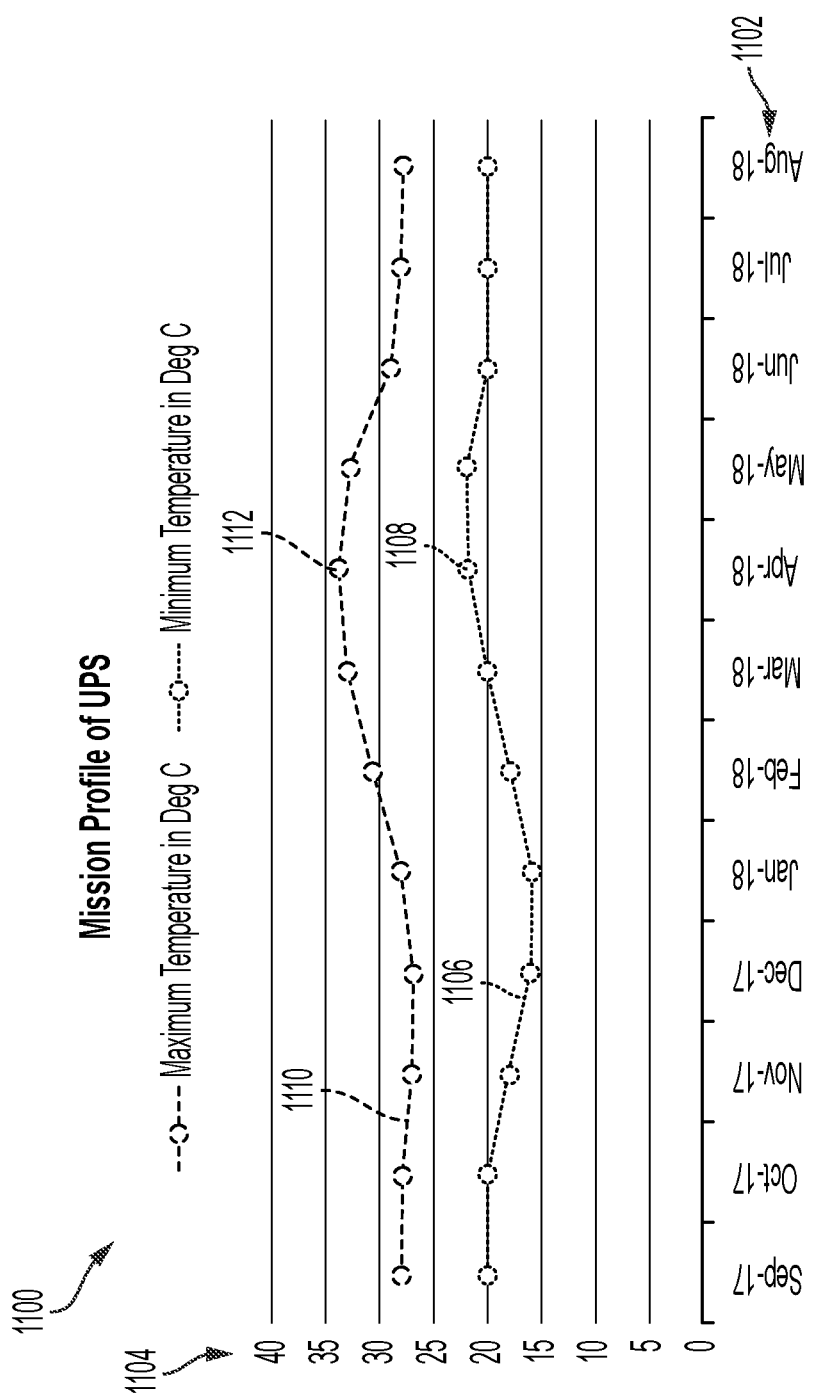
FIG. 11 illustrates a graph of component lifetime prognostic information according to a fourth example.

FIG. 11 illustrates a graph 1100 of component lifetime prognostic information according to a fourth example. The graph 1100 may be generated by a server, such as the server 204, based on information received from multiple devices, including the UPS 202. The server may receive component information from each of the multiple devices over a period of time and generate the graph 1100 based on all or a subset of the received component information. For example, the server 204 may be a cloud server configured to receive component information from multiple devices including the UPS 202 pertaining to relay components. In another example, the graph 1100 may be generated based on information received from a single device, such as the UPS 202.

The graph 1100 may indicate a range of temperature values of at least one component for various past periods of time. More particularly, the graph 1100 includes an x-axis 1102 indicating time partitions (for example, each month of a year-long period), a y-axis 1104 indicating a temperature measured in degrees Celsius, a first trace 1106 indicating a minimum temperature of the at least one component and including a first data point 1108, and a second trace 1110 indicating a maximum temperature of the at least one component and including a second data point 1112. For example, the at least one component may be a single relay, multiple relays within a device, multiple relays across multiple devices, and so forth.

The graph 1100 may provide historical temperature extrema information such that a user may have additional operating condition information pertinent to the at least one component. In some examples, additional operating condition information may be beneficial in understanding or diagnosing device operation. For example, where a component failure is particularly high in April 2018, the graph 1100 may provide advantageous information to determine a cause of the component failure. More particularly, the first data point 1108 and the second data point 1110 indicate that a temperature of the at least one component ranged between approximately 21 degrees Celsius and 12 degrees Celsius during April 2018, which are amongst the highest temperatures indicated by the first trace 1106 and the second trace 1110. Accordingly, it may be determined that higher component failure rates are accompanied by, and potentially caused by, higher temperature ranges.

Although the graph 1100 provides one example of operation information (that is, a minimum and maximum temperature), any other form of mission profile information may be provided as prognostic information. For example, historical mission profile information may be provided indicating an average temperature, ranges of current conducted by the at least one component, ranges of voltage across the at least one component, ranges of power consumed by the at least one component, a total power consumed by the at least one component during each respective period of time, and so forth. Accordingly, in various examples, various types of operation information may be used as a basis of historical prognostic information.

As discussed above, the server 204 may generate the graph 1100. The server 204 may generate the graph 1100 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1100 to provide a user with an optimal amount of information. In still another example, the server 204 may generate the graph 1100 based on component information received from a single device, such as the UPS 202. For example, the server 204 may generate the graph 1100 based on component information for every relay in the UPS 202.

Furthermore, the period of time over which component information is analyzed may be controlled or configurable. For example, a user may configure or control the server 204 to generate the graph 1100 based on component information received over the past day, week, year, or any other time period. In other examples, the server 204 may dynamically determine an optimal period of time to provide a user with an optimal amount of information.

Figure 12:
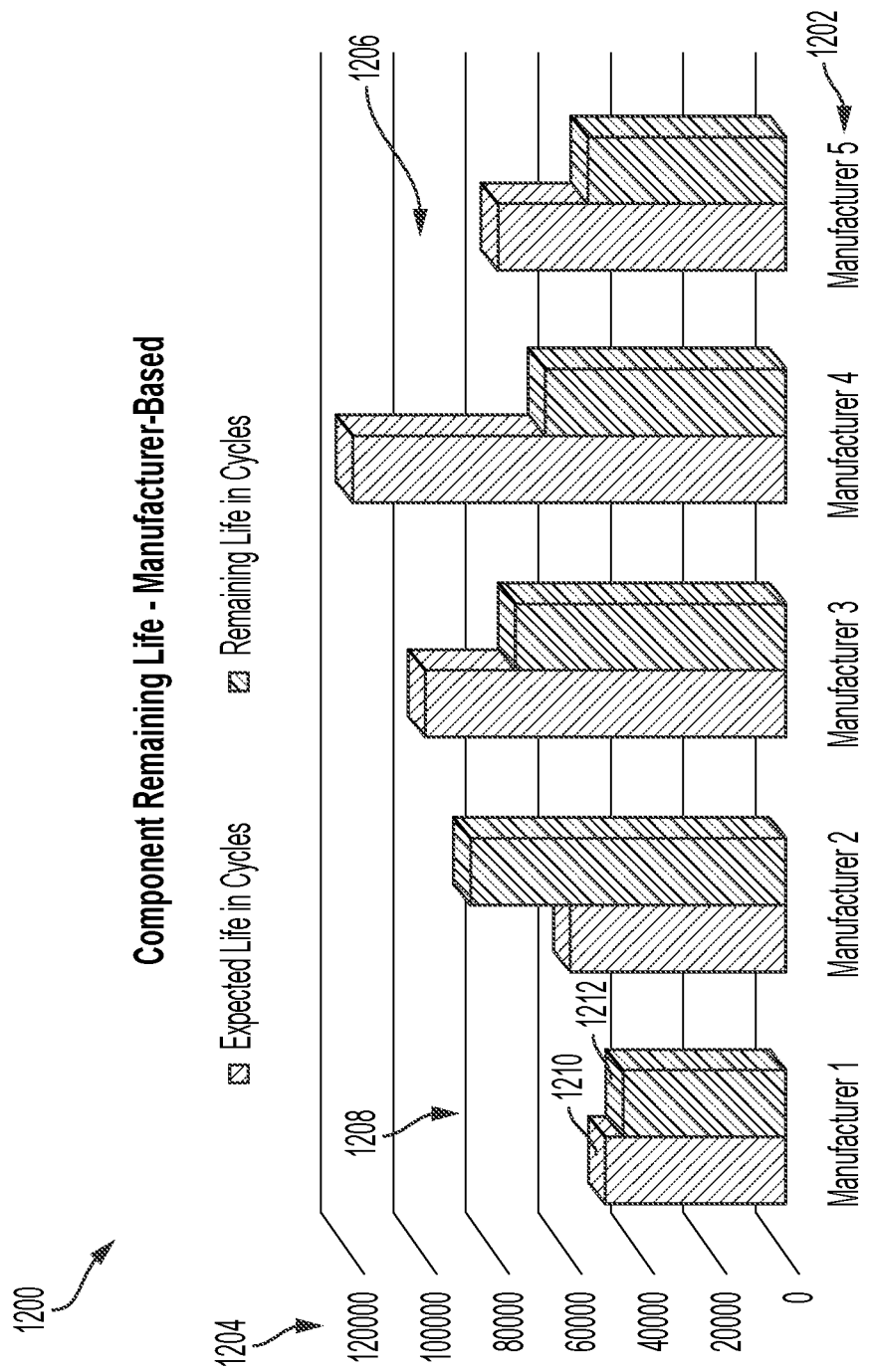
FIG. 12 illustrates a graph of component lifetime prognostic information according to a fifth example.

FIG. 12 illustrates a graph 1200 of component lifetime prognostic information according to a fifth example. The graph 1200 may be generated by a server, such as the server 204, based on information received from multiple devices, including the UPS 202. The server may receive component information from each of the multiple devices over a period of time and generate the graph 1200 based on all or a subset of the received component information. For example, the server 204 may be a cloud server configured to receive component information from multiple devices including the UPS 202 pertaining to relay components. In various examples, the graph 1200 may be generated based on component information received from a single device, such as the UPS 202.

The graph 1200 includes an x-axis 1202 indicating enumerated component manufacturers, a y-axis 1204 indicating a remaining lifetime for at least one component manufactured by a corresponding one of the enumerated component manufacturers, and groups of data bars 1206 including a first group of data bars 1208 corresponding to a first manufacturer. Each of the groups of data bars 1206 includes a first bar indicating an expected total lifetime of at least one component manufactured by a respective manufacturer, and a second bar indicating a remaining lifetime of the at least one component. While alternate metrics of component lifetime may be implemented, the graph 1200 illustrates an example in which the at least one component includes a relay, and a lifetime thereof is indicated in relay cycles. For example, the first group of data bars 1208 includes a first bar

1210 indicating an expected total lifetime of at least one relay manufactured by the first manufacturer measured in cycles of the at least one relay, and a second bar 1212 indicating a remaining lifetime of the at least one relay measured in cycles of the at least one relay.

More particularly, the first bar 1210 indicates that the at least one relay manufactured by the first manufacturer has an expected total lifetime of approximately 45,000 cycles. The second bar 1212 indicates that the at least one relay has a remaining lifetime of approximately 40,000 cycles. Other groups of data bars within the groups of data bars 1206 similarly indicate component lifetime information for other manufacturers. Accordingly, the graph 1200 may be advantageous in, for example, comparing component lifetime information between various components manufactured by various manufacturers.

In other examples, the server (for example, the server 204) may generate graphs similar to the graph 1200 based on component information received from any number of devices and pertaining to any type of component, such as relays, capacitors, energy storage devices, and so forth. Although the y-axis 1204 may indicate lifetime as a number of relay cycles, in other examples, the y-axis 1204 may indicate any appropriate lifetime metric, such as a number of days, weeks, months, years, and so forth, of a remaining lifetime.

As discussed above, the server 204 may generate the graph 1200 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1200 to provide a user with an optimal amount of information. In still another example, the server 204 may generate the graph 1200 based on component information received from a single device, such as the UPS 202. For example, the server 204 may generate the graph 1200 based on component information for every relay in the UPS 202.

Furthermore, the period of time over which component information is analyzed may be controlled or configurable. For example, a user may configure or control the server 204 to generate the graph 1200 based on component information received over the past day, week, year, or any other time period. In other examples, the server 204 may dynamically determine an optimal period of time to provide a user with an optimal amount of information. In still other examples, the server 204 may generate the graph 1200 based on components initially implemented within a substantially similar period of time (for example, within the same day, week, month, and so forth) such that the manufacturers' components' performances may be compared more easily. That is, information provided by the graph 1200 may be more beneficial where the graph 1200 pertains to components that have all been in operation for a substantially equal amount of time, whether in the same or a different device (for example, the UPS 202).

Figure 13:
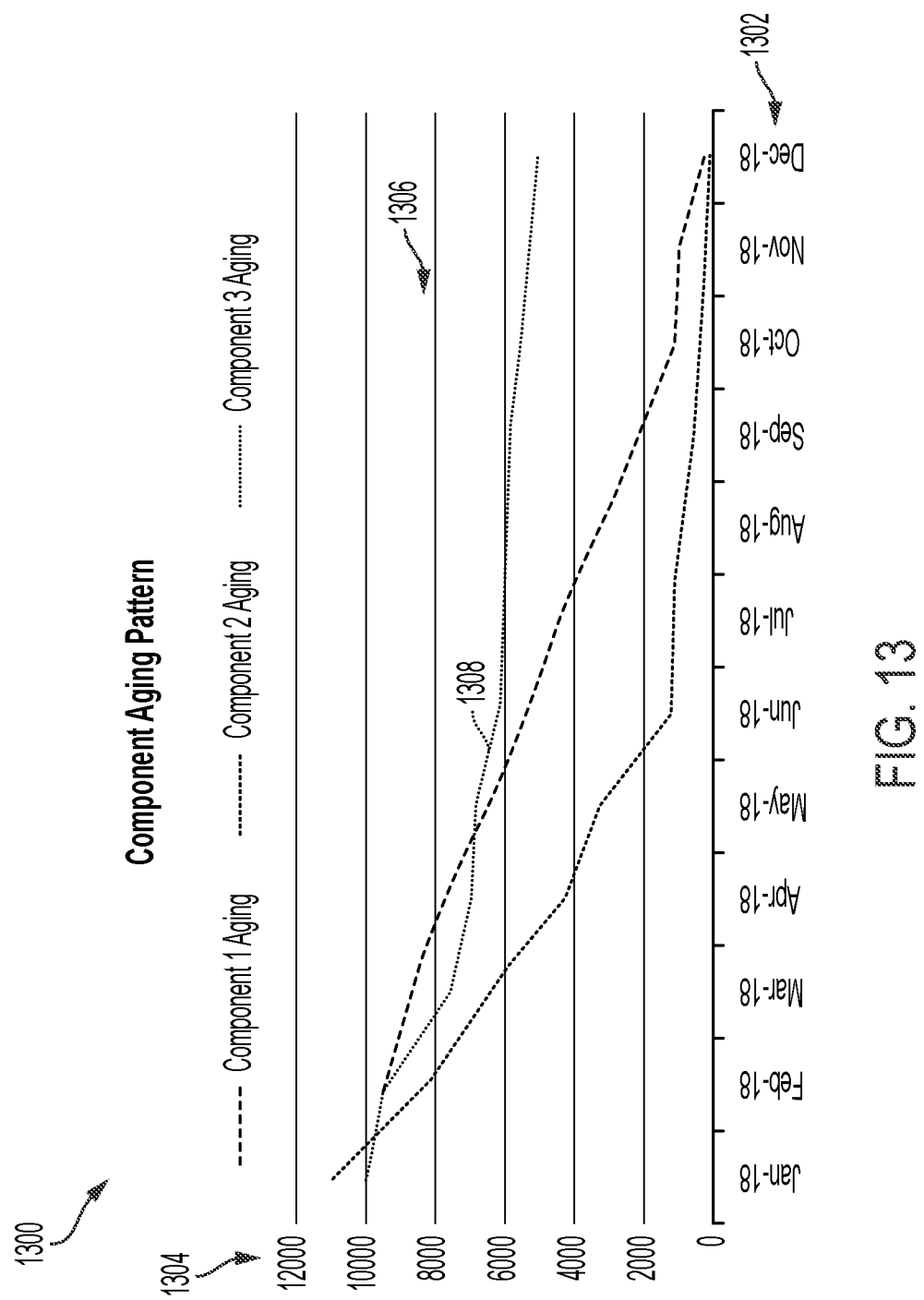
FIG. 13 illustrates a graph of component lifetime prognostic information according to a sixth example.

FIG. 13 illustrates a graph 1300 of component lifetime prognostic information according to a sixth example. The graph 1300 may be generated by a server, such as the server 204, based on information received from multiple devices, including the UPS 202. The server may receive component information from each of the multiple devices over a period of time and generate the graph 1300 based on all or a subset of the received component information. For example, the server 204 may be a cloud server configured to receive component information from multiple devices including the UPS 202 pertaining to relay components. In various examples, the graph 1300 may be generated based on component information received from a single device, such as the UPS 202.

The graph 1300 includes an x-axis 1302 indicating time partitions (for example, each month of a year-long period), a y-axis 1304 indicating a remaining lifetime for at least one component, and traces 1306 each indicating a remaining lifetime of a respective component, the traces 1306 including a first trace 1308 corresponding to a first component. While alternate metrics of component lifetime may be implemented, the graph 1300 illustrates an example in which the at least one component includes a relay, and a lifetime thereof is indicated in relay cycles. That is, the y-axis 1304 indicates a remaining lifetime in terms of a number of remaining relay cycles. For example, the first trace 1308 traces a remaining lifetime of a relay from approximately 10,000 remaining cycles in January 2018 to approximately 5,000 remaining cycles in December 2018.

In other examples, the server (for example, the server 204) may generate graphs similar to the graph 1300 based on component information received from any number of devices and pertaining to any type of component, such as relays, capacitors, energy storage devices, and so forth. Although the y-axis 1304 may indicate lifetime as a number of relay cycles in some examples, in other examples, the y-axis 1304 may indicate any appropriate lifetime metric, such as a number of days, weeks, months, years, and so forth, of a remaining lifetime.

As discussed above, the server 204 may generate the graph 1300 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1300 to provide a user with an optimal amount of information. In still another example, the server 204 may generate the graph 1300 based on component information received from a single device, such as the UPS 202. For example, the server 204 may generate the graph 1300 based on component information for every relay in the UPS 202.

Furthermore, the period of time over which component information is analyzed may be controlled or configurable. For example, a user may configure or control the server 204 to generate the graph 1300 based on component information received over the past day, week, year, or any other time period. In other examples, the server 204 may dynamically determine an optimal period of time to provide a user with an optimal amount of information. In still other examples, the server 204 may generate the graph 1300 based on components initially implemented within a substantially similar period of time (for example, within the same day, week, month, and so forth) such that the components' aging patterns may be compared more easily. That is, information provided by the graph 1300 may be more beneficial where the graph 1300 pertains to components that have all been in operation for a substantially equal amount of time, whether in the same or a different device (for example, the UPS 202).

Figure 14:
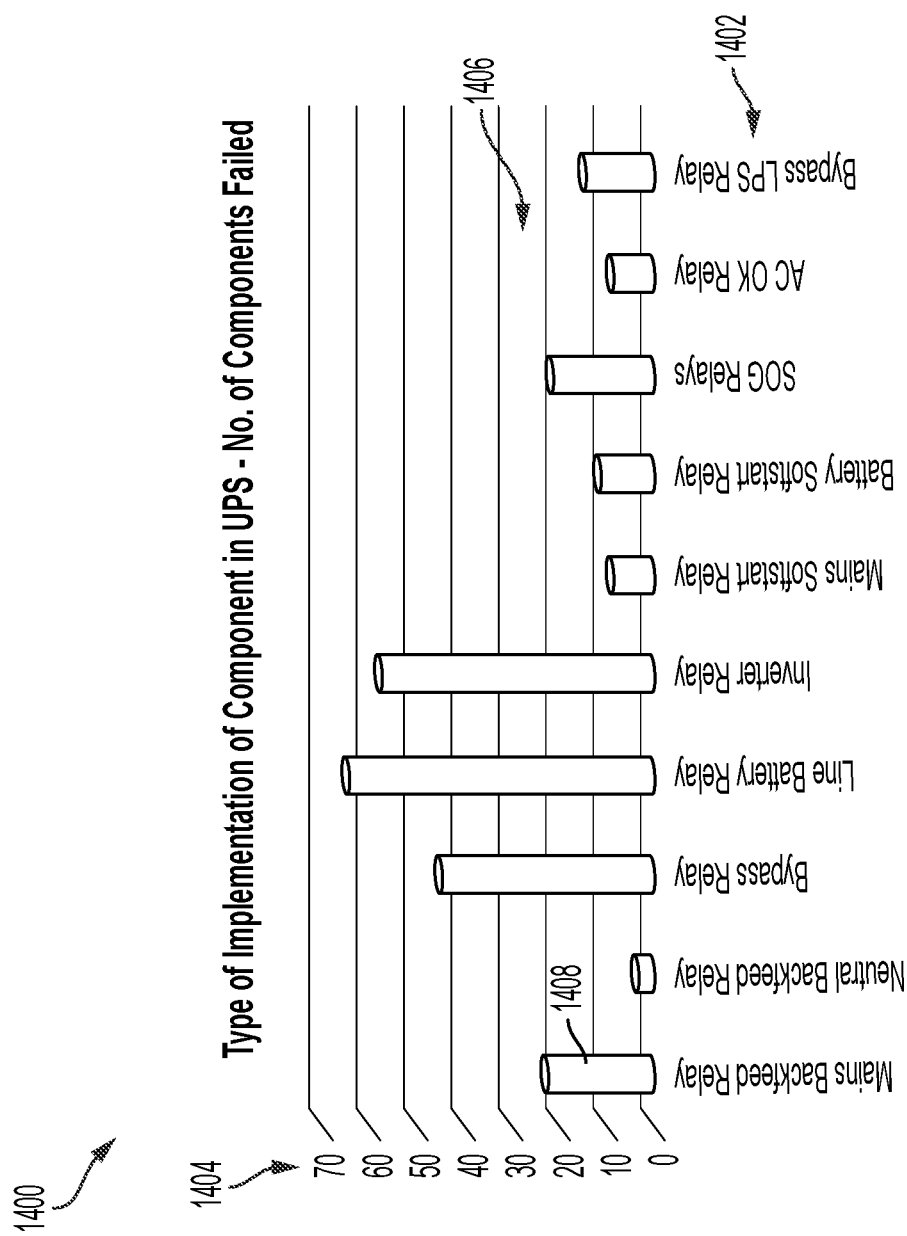
FIG. 14 illustrates a graph of component lifetime prognostic information according to a seventh example.

FIG. 14 illustrates a graph 1400 of component lifetime prognostic information according to a seventh example. The graph 1400 may be generated by a server, such as the server 204, based on information received from multiple devices, including the UPS 202. The server may receive component information from each of the multiple devices over a period of time and generate the graph 1400 based on all or a subset of the received component information. For example, the server 204 may be a cloud server configured to receive component information from multiple devices including the UPS 202 pertaining to relay components. In various examples, the graph 1400 may be generated based on component information received from a single device, such as the UPS 202.

The graph 1400 may indicate a number of components of a certain type which have failed, categorized by a type of implementation of the components. More particularly, the graph 1400 includes an x-axis 1402 indicating a type of implementation of at least one component, a y-axis 1404 indicating a number of components that have failed for a corresponding type of implementation, and bars 1406, each indicating a number of component failures for a respective type of implementation and including a first bar 1408. While alternate components implemented in alternate devices may be indicated by the graph 1400, the graph 1400 illustrates an example in which the at least one component includes at least one relay implemented in at least one UPS, such as the UPS 202. That is, the x-axis 1402 indicates a type of implementation of at least one relay in at least one UPS, and the y-axis 1404 indicates a number of relay failures for each type of implementation. For example, the first bar 1408 indicates that approximately 20 relays implemented as mains backfeed relays in at least one UPS have failed.

In other examples, the server (for example, the server 204) may generate graphs similar to the graph 1400 based on component information received from any type and/or number of devices and pertaining to any type of component, such as relays, capacitors, energy storage devices, and so forth. Although the x-axis 1402 indicates certain types of component implementations, in other examples, the graph 1400 may indicate other types of component implementations, where the component may include any type of component implemented in any type of device.

As discussed above, the server 204 may generate the graph 1400 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1400 to provide a user with an optimal amount of information. In still another example, the server 204 may generate the graph 1400 based on component information received from a single device, such as the UPS 202. For example, the server 204 may generate the graph 1400 based on component information for every relay in the UPS 202.

Furthermore, the period of time over which component information is analyzed may be controlled or configurable. For example, a user may configure or control the server 204 to generate the graph 1400 based on component information received over the past day, week, year, or any other time period. In other examples, the server 204 may dynamically determine an optimal period of time to provide a user with an optimal amount of information. In still other examples, the server 204 may generate the graph 1400 based on components initially implemented within a substantially similar period of time (for example, within the same day, week, month, and so forth) such that the components' failure rates may be compared more easily. That is, information provided by the graph 1400 may be more beneficial where the graph 1400 pertains to components that have all been in operation for a substantially equal amount of time, whether in the same or a different device (for example, the UPS 202), to determine which types of implementations yield the highest component failure rates.

Figure 15:
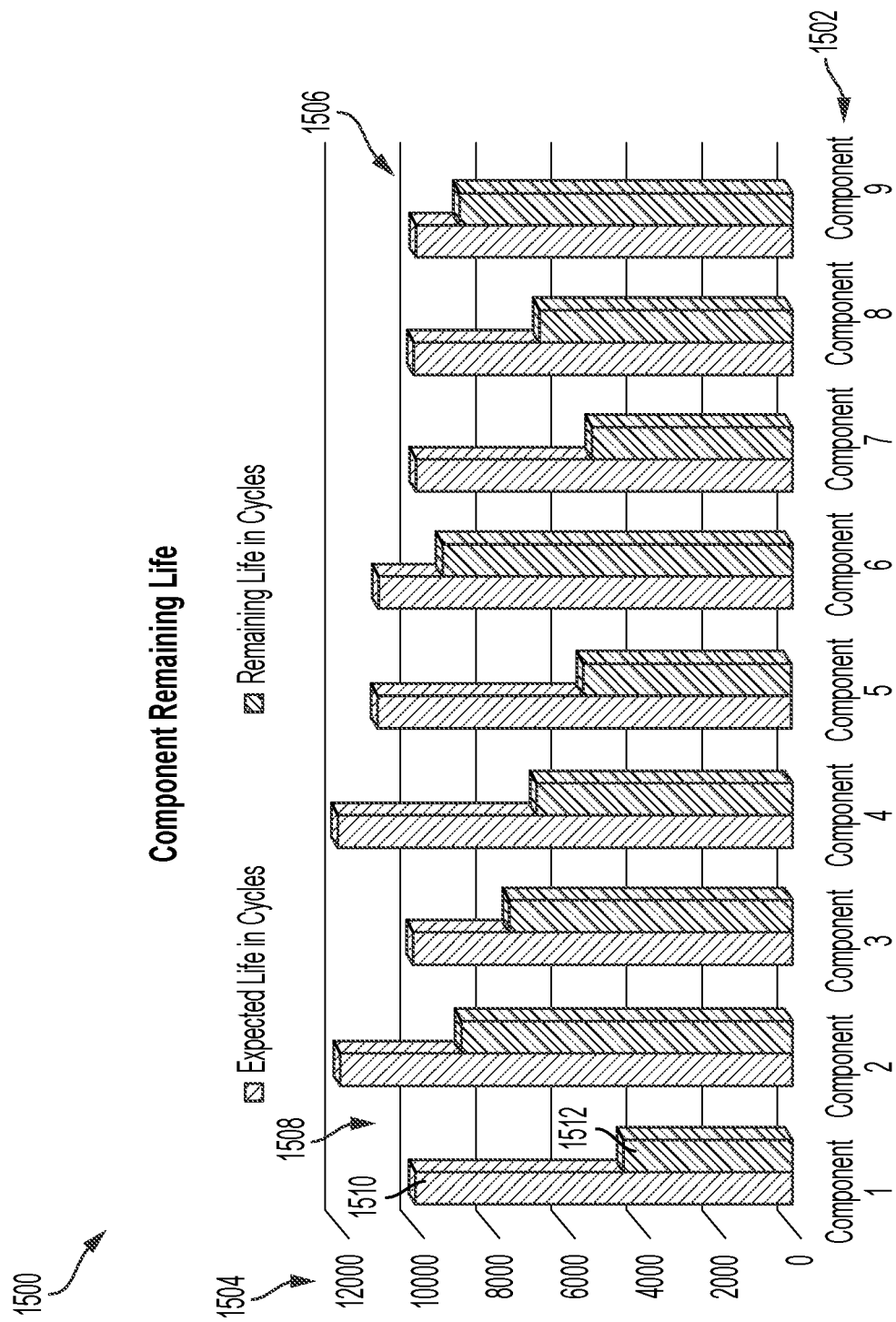
FIG. 15 illustrates a graph of component lifetime prognostic information according to an eighth example.

FIG. 15 illustrates a graph 1500 of component lifetime prognostic information according to an eighth example. The graph 1500 may be generated by a server, such as the server 204, based on information received from multiple devices, including the UPS 202. The server may receive component information from each of the multiple devices over a period of time and generate the graph 1500 based on all or a subset of the received component information. For example, the server 204 may be a cloud server configured to receive component information from multiple devices including the UPS 202 pertaining to relay components. In various examples, the graph 1500 may be generated based on component information received from a single device, such as the UPS 202.

The graph 1500 includes an x-axis 1502 indicating enumerated components, a y-axis 1504 indicating a lifetime for each respective enumerated component, and groups of bars 1506 including a first group of bars 1508 corresponding to a first enumerated component. Each of the groups of data bars 1506 includes a first bar indicating an expected total lifetime of at least one component, and a second bar indicating a remaining lifetime of the at least one component. While alternate metrics of component lifetime may be implemented, the graph 1500 illustrates an example in which the enumerated components include relays, and a lifetime thereof is indicated in relay cycles. That is, the y-axis 1504 indicates a lifetime in terms of a number of relay cycles.

For example, the first group of bars 1508 includes a first bar 1510 indicating an expected total lifetime of the first enumerated component, and a second bar 1512 indicating a remaining lifetime of the first enumerated component. More particularly, the first bar 1510 indicates that the first enumerated component, which may be a first relay, has an expected total lifetime of approximately 9,800 cycles, and the second bar 1512 indicates that the first relay has a remaining lifetime of approximately 4,100 cycles.

In other examples, the server (for example, the server 204) may generate graphs similar to the graph 1500 based on component information received from any number of devices and pertaining to any type of component, such as relays, capacitors, energy storage devices, and so forth. Although the y-axis 1504 may indicate lifetime as a number of relay cycles, in other examples, the y-axis 1504 may indicate any appropriate lifetime metric, such as a number of days, weeks, months, years, and so forth, of a remaining lifetime.

As discussed above, the server 204 may generate the graph 1500 based on component information received from a group of devices, including the UPS 202, over a period of time. The devices included in the group of devices may be configurable, such as by being user-configurable. For example, a user may configure or control the server 204 to provide component lifetime prognostic information based on a group of devices including the UPS 202 and any other devices in a data center in which the UPS 202 is implemented for which component information is available. In other examples, the server 204 may dynamically determine an optimal group of devices from which to generate the graph 1500 to provide a user with an optimal amount of information. In still another example, the server 204 may generate the graph 1500 based on component information received from a single device, such as the UPS 202. For example, the server 204 may generate the graph 1500 based on component information for every relay in the UPS 202.

Furthermore, the period of time over which component information is analyzed may be controlled or configurable. For example, a user may configure or control the server 204 to generate the graph 1500 based on component information received over the past day, week, year, or any other time period. In other examples, the server 204 may dynamically determine an optimal period of time to provide a user with an optimal amount of information. In still other examples, the server 204 may generate the graph 1500 based on components initially implemented within a substantially similar period of time (for example, within the same day, week, month, and so forth) such that the components' aging patterns may be compared more easily. That is, information provided by the graph 1500 may be more beneficial where the graph 1500 pertains to components that have all been in operation for a substantially equal amount of time, whether in the same or a different device (for example, the UPS 202).

Accordingly, prognostic information may be provided to one or more users or operators by one or more servers, such as the server 204. In various examples, users may interact with the prognostic information to filter or expand on the prognostic information. For example, in various examples discussed above, prognostic information may provide a number of components meeting various criteria. In FIG. 8, for example, the data bar 808 indicates a number of relays, of a group of relays, having between 90% and 100% of remaining life.

Users may interact with the graph 800 in various examples to expand on the information indicated by the data bar 808. For example, users may view a list of relays indicated by the data bar 808. The list of relays may include model information, an indication of a device in which each relay is implemented in, and so forth. In another example, users may generate additional prognostic information based on the information indicated by the data bar 808. For example, the user may view the list of relays indicated by the data bar 808 and generate a graph, similar to the graph 900, indicating time periods within which each of the relays within the list of relays will fail. Accordingly, users may interact with each of the graphs 800-1500 (for example, via the server 204 or via the user device 206) to expand on or filter information included in or represented by the graphs 800-1500.

Various controllers, such as the controller 112, may execute various operations discussed above. Using data stored in associated memory, the controller 112 also executes one or more instructions stored on one or more non-transitory computer-readable media that may result in manipulated data. In some examples, the controller 112 may include one or more processors or other types of controllers. In one example, the controller 112 is or includes a commercially available, general-purpose processor. In another example, the controller 112 performs at least a portion of the operations discussed above using an application-specific integrated circuit (ASIC) tailored to perform particular operations in addition to, or in lieu of, a general-purpose processor. As illustrated by these examples, examples in accordance with the present invention may perform the operations described herein using many specific combinations of hardware and software and the invention is not limited to any particular combination of hardware and software components.

In various examples, the controller 112 may implement a multi-threading process to execute operations discussed above. For example, while a first thread of the controller 112 may perform operations including determining a relay load type (for example, as discussed above with respect to act 614) and determining a relay load current (for example, as discussed above with respect to act 616), a second thread of the controller 112 may calculate one or more degradation factors (for example, as discussed above with respect to acts 620, 626, and 628) and determine an effective number of relay cycles consumed (for example, as discussed above with respect to act 634). In other examples, any number of threads may be implemented by the controller 112 to execute any combination of operations, including acts discussed above with respect to the processes 300-700.

Current uninterruptible power supply systems at least typically cannot determine remaining relay lifetime information indicating an accurate number of remaining relay cycles. This is a technical problem. An exemplary embodiment of an uninterruptible power supply may comprise a sensor, a relay, and a controller that determines a manufacturer's total estimated relay lifetime based on stored relay specifications, receives operational parameters of the relay (for example, current conducted), determines the cycles consumed based on the parameters, and outputs an indication of a modified number of remaining relay cycles based on the difference between the manufacturer estimated lifetime and the number of cycles consumed. At least this foregoing combination of features comprises an uninterruptible power supply that serves as a technical solution to the foregoing technical problem. This technical solution is not routine and is unconventional. This technical solution is a practical application of the uninterruptible power supply design that solves the foregoing technical problem and constitutes an improvement in the technical field of uninterruptible-power-supply design at least by facilitating an estimate of remaining relay cycles more accurately that current systems.

Current uninterruptible power supplies at least typically cannot determine remaining relay lifetime information indicating an accurate number of remaining relay cycles. This is a technical problem. An exemplary embodiment of an uninterruptible power supply may comprise a sensor and a relay, determine a manufacturer's total estimated relay lifetime based on stored relay specifications, receive operational parameters of the relay (for example, current conducted), determine the effective cycles consumed based on the parameters, and output a modified number of remaining relay cycles based on the difference between the manufacturer estimated lifetime and the effective number of cycles consumed. At least this foregoing combination of features comprises an uninterruptible power supply that serves as a technical solution to the foregoing technical problem. This technical solution is not routine and is unconventional in the field of uninterruptible power supply design. This technical solution is a practical application of the uninterruptible power supply design that solves the foregoing technical problem and constitutes an improvement in the technical field of uninterruptible power supply design at least by facilitating an estimate of remaining relay lifetime and/or cycles more accurately that current systems.

Current component analysis systems at least typically cannot determine relay lifetime prognostic information indicating the remaining lifetime of relays. This is a technical problem. An exemplary embodiment of a component analysis system may comprise a computing device in communication with uninterruptible power supplies with relays. The computing device may receive manufacturer's total estimated relay lifetime, receive operational parameters of operation of relays (for example, current conducted), determine the effective cycles consumed based on the parameters, determine a modified number of relay cycles remaining based on the difference between the manufacturer estimated lifetime and the effective number of cycles consumed, and output relay lifetime prognostic information based on the modified number or relay cycles remaining. At least this foregoing combination of features comprises a component analysis system that serves as a technical solution to the foregoing technical problem. This technical solution is not routine and is unconventional in the fields of uninterruptible-power-supply maintenance, information technology, and emergency-power management. This technical solution is a practical application of the component analysis systems that solves the foregoing technical problem and constitutes an improvement in the technical fields of uninterruptible-power-supply maintenance, information technology, and emergency-power management at least by facilitating an estimate of remaining relay lifetime and/or cycles more accurately that current systems.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An uninterruptible power supply comprising:
    an input configured to receive input power;
    a backup power supply configured to output backup power;
    an output configured to be coupled to at least one load, and configured to provide output power from at least one of the input or the backup power supply to the at least one load;
    at least one sensor;
    at least one relay; and
    a controller coupled to the at least one sensor and to the at least one relay, the controller being configured to:
        determine, based on stored relay specifications, a manufacturer total estimated relay lifetime;
        receive operational information indicative of operational parameters of operation of the at least one relay from the at least one sensor, the operational information including a current conducted by the at least one relay;
        identify, responsive to identifying a switching event of the at least one relay, a load type of a load of the at least one relay;
        determine, based on the operational information, an effective number of relay cycles consumed by the operation of the at least one relay;
        determine a modified number of remaining relay cycles, the modified number of remaining relay cycles being based on a difference between the manufacturer total estimated lifetime and the effective number of relay cycles consumed; and
        output remaining relay lifetime information indicative of the modified number of remaining relay cycles.

2. The uninterruptible power supply of claim 1, further comprising a display, wherein the controller is configured to display the remaining relay lifetime information on the display.

3. The uninterruptible power supply of claim 1, wherein the operational parameters include at least one of electrical parameters or environmental parameters.

4. The uninterruptible power supply of claim 1, further comprising a communications interface configured to be communicatively coupled to at least one server, wherein the controller is further configured to provide component information indicative of the at least one relay to the at least one server via the communications interface.

5. The uninterruptible power supply of claim 4, wherein the component information includes at least one of the remaining relay lifetime information, the operational information, or the stored relay specifications.

6. The uninterruptible power supply of claim 1, wherein in determining the manufacturer total estimated relay lifetime, the controller is further configured to:
    retrieve manufacturer-supplied information indicative of an estimated total lifetime of the at least one relay at a test relay load current and a test relay temperature; and
    determine, based on the manufacturer-supplied information, an initial remaining lifetime of the at least one relay.

7. The uninterruptible power supply of claim 6, wherein the load type includes at least one of a resistive load type, a capacitive load type, or an inductive load type, and the switching event includes at least one of the at least one relay switching from a conducting state to a non-conducting state or from a non-conducting state to a conducting state.

8. The uninterruptible power supply of claim 7, wherein identifying the load type includes:
    acquiring electrical parameter samples including at least one of a plurality of current samples or a plurality of voltage samples of the at least one relay; and
    determining the load type based on one or more of:
        identifying a pattern match between the electrical parameter samples and a reference pattern corresponding to a known load type;
        determining that the electrical parameter samples are stable within a threshold range of values; or
        determining a phase difference between the plurality of voltage samples and the plurality of current samples.

9. The uninterruptible power supply of claim 7, wherein the controller is further configured to:
    receive, from the at least one sensor, at least one current sample indicative of a current through the at least one relay; and
    receive, from the at least one sensor, at least one temperature sample indicative of a temperature of the at least one relay.

10. The uninterruptible power supply of claim 9, wherein the controller is further configured to:
    determine a current stress factor of the at least one relay based on a difference between the at least one current sample indicative of the current through the at least one relay and the test relay load current; and
    determine a temperature stress factor of the at least one relay based on a difference between the at least one temperature sample indicative of the temperature of the at least one relay and the test relay temperature.

11. The uninterruptible power supply of claim 10, wherein the controller is further configured to determine a degradation rate of the at least one relay based on the current stress factor and the temperature stress factor.

12. The uninterruptible power supply of claim 11, wherein the controller is further configured to:
determine, based on the degradation rate, an effective number of switching cycles consumed by the switching event; and
determine, based on a difference between the estimated total lifetime and the effective number of switching cycles consumed by the switching event, the remaining lifetime of the at least one relay.

13. A component analysis system comprising:
at least one computing device communicatively coupled to a plurality of uninterruptible power supplies, the plurality of uninterruptible power supplies including a plurality of relays, the at least one computing device being configured to:
receive a respective manufacturer total estimated relay lifetime for each relay of the plurality of relays;
receive respective operational information indicative of operational parameters of operation of each relay of the plurality of relays;
identify, responsive to identifying a respective switching event of each relay of the plurality of relays, a load type of a respective load of each relay of the plurality of relays;
determine, for each relay based on the respective operational information, a respective effective number of relay cycles consumed by operation of the respective relay;
determine, for each relay, a modified number of remaining relay cycles based on a difference between the respective manufacturer total estimated lifetime and the respective effective number of relay cycles consumed;
determine, based on the modified number of remaining relay cycles for each relay of the plurality of relays, relay lifetime prognostic information indicative of a remaining lifetime of the plurality of relays; and
output the relay lifetime prognostic information.

14. The component analysis system of claim 13, wherein the operational parameters include at least one of electrical parameters or environmental parameters.

15. The component analysis system of claim 13, wherein the at least one computing device is further configured to provide the modified number of remaining relay cycles for a respective relay to a respective uninterruptible power supply that includes the respective relay.

16. The component analysis system of claim 13, wherein the relay lifetime prognostic information includes at least one of:
information indicative of a remaining lifetime of each relay of the plurality of relays;
information indicative of an expected failure time of each relay of the plurality of relays;
information indicative of a load type of each relay of the plurality of relays;
information indicative of a remaining lifetime of each relay of the plurality of relays based on a corresponding manufacturer;
information indicative of aging over time of each relay of the plurality of relays; or
information indicative of a number of failures of failed relays based on a corresponding type of implementation.

17. A non-transitory computer-readable medium storing thereon sequences of computer-executable instructions for operating an uninterruptible power supply including at least one sensor and at least one relay, the sequences of computer-executable instructions including instructions that instruct at least one processor to:
determine, based on stored relay specifications, a manufacturer total estimated relay lifetime;
receive operational information indicative of operational parameters of operation of the at least one relay;
identify, responsive to identifying a switching event of the at least one relay, a load type of a load of the at least one relay;
determine, based on the operational information, an effective number of relay cycles consumed by the operation of the at least one relay;
determine a modified number of remaining relay cycles, the modified number of remaining relay cycles being based on a difference between the manufacturer total estimated lifetime and the effective number of relay cycles consumed; and
output remaining relay lifetime information indicative of the modified number of remaining relay cycles.

18. The non-transitory computer-readable medium of claim 17, wherein the operational parameters include at least one of electrical parameters and environmental parameters.

19. The non-transitory computer-readable medium of claim 17, wherein the uninterruptible power supply further includes a communications interface configured to be communicatively coupled to at least one server, wherein the instructions are further configured to instruct the at least one processor to provide component information indicative of the at least one relay to the at least one server via the communications interface.

20. The non-transitory computer-readable medium of claim 19, wherein the component information includes at least one of the remaining relay lifetime information, the operational information, or the stored relay specifications.

* * * * *